United States Patent
Nakayama et al.

(10) Patent No.: US 8,801,973 B2
(45) Date of Patent: *Aug. 12, 2014

(54) OXIDE SINTERED BODY AND PRODUCTION METHOD THEREFOR, TARGET, AND TRANSPARENT CONDUCTIVE FILM AND TRANSPARENT CONDUCTIVE SUBSTRATE OBTAINED BY USING THE SAME

(71) Applicant: Sumitomo Metal Mining Co., Ltd., Tokyo (JP)

(72) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/834,305

(22) Filed: Mar. 15, 2013

(65) Prior Publication Data

US 2013/0202850 A1 Aug. 8, 2013

Related U.S. Application Data

(62) Division of application No. 12/452,063, filed as application No. PCT/JP2008/061957 on Jul. 2, 2008, now Pat. No. 8,440,115.

(30) Foreign Application Priority Data

Jul. 6, 2007 (JP) ................................. 2007-178879

(51) Int. Cl.
*H01B 1/08* (2006.01)
*C23C 14/08* (2006.01)
*C04B 35/01* (2006.01)
*C03C 17/245* (2006.01)
*C23C 14/34* (2006.01)

(52) U.S. Cl.
CPC ........... *C23C 14/3414* (2013.01); *C23C 14/086* (2013.01); *C04B 2235/3256* (2013.01); *C04B 2235/80* (2013.01); *C04B 35/01* (2013.01); *C04B 2235/3244* (2013.01); *C04B 2235/3251* (2013.01); *C04B 2235/3287* (2013.01); *C04B 2235/5445* (2013.01); *C03C 17/245* (2013.01); *C04B 2235/3286* (2013.01); *C23C 14/3407* (2013.01); *C04B 2235/3229* (2013.01); *C04B 2235/77* (2013.01); *C04B 2235/786* (2013.01); *H01B 1/08* (2013.01); *C04B 2235/3293* (2013.01); *C04B 2235/3418* (2013.01); *C04B 2235/3232* (2013.01); *C04B 2235/3258* (2013.01)
USPC ..................... 252/520.1; 252/518.1; 428/412; 204/298.13

(58) Field of Classification Search
CPC .. H01B 1/08; C23C 14/3414; C23C 14/3407; C23C 14/086; C23C 14/08; C04B 35/01; C03C 17/245; C03C 17/2453
USPC ......... 252/520.1, 518.1; 428/412; 204/298.13
See application file for complete search history.

(56) References Cited

U.S. PATENT DOCUMENTS

| | | |
|---|---|---|
| 5,473,456 A | 12/1995 | Cava et al. |
| 7,476,343 B2 | 1/2009 | Nakayama et al. |
| 7,611,646 B2 | 11/2009 | Nakayama et al. |
| 7,641,818 B2 | 1/2010 | Nakayama et al. |
| 1,006,248 A1 | 3/2011 | Nakayama et al. |
| 7,960,033 B2 | 6/2011 | Nakayama et al. |
| 7,998,603 B2 | 8/2011 | Nakayama et al. |
| 8,080,182 B2 | 12/2011 | Nakayama et al. |
| 8,440,115 B2 * | 5/2013 | Nakayama et al. ........ 252/520.1 |
| 2004/0180217 A1 | 9/2004 | Inoue et al. |
| 2004/0222089 A1 | 11/2004 | Inoue et al. |
| 2007/0184286 A1 | 8/2007 | Nakayama et al. |
| 2007/0200100 A1 | 8/2007 | Nakayama et al. |
| 2008/0032106 A1 | 2/2008 | Nakayama et al. |
| 2008/0038529 A1 | 2/2008 | Nakayama et al. |
| 2010/0078192 A1 | 4/2010 | Nakayama et al. |
| 2011/0084280 A1 | 4/2011 | Nakayama et al. |
| 2011/0168994 A1 | 7/2011 | Kawashima et al. |

FOREIGN PATENT DOCUMENTS

| | | |
|---|---|---|
| EP | 1422312 A1 | 5/2004 |
| EP | 1422316 A1 | 5/2004 |
| JP | 07-182924 A | 7/1995 |

(Continued)

OTHER PUBLICATIONS

"Technology of a transparent conductive film (the second Revised version)", Ohmsha, Ltd., published on Dec. 20, 2006, p. 207 to 210, 238 to 239, 243 to 250.
International Search Report dated Oct. 7, 2008, issued on PCT/JP2008/061957.
Supplementary European Search Report dated May 13, 2011, issued for the corresponding European patent application No. 08777760.3.
Office Action mailed Mar. 18, 2014, issued for the corresponding Japanese Patent Application No. 2009-522592.

* cited by examiner

*Primary Examiner* — Douglas Mc Ginty
(74) *Attorney, Agent, or Firm* — Edwards Wildman Palmer LLP

(57) ABSTRACT

A target for sputtering or a tablet for ion plating, an oxide sintered body suitable for obtaining the same and a production method therefor, and a transparent conductive film having low absorption of blue light and low specific resistance, obtained by using the same are provided by an oxide sintered body having indium and gallium as an oxide, characterized in that an $In_2O_3$ phase with a bixbyite-type structure forms a major crystal phase, and a $GaInO_3$ phase of a $\beta$-$Ga_2O_3$-type structure, or $GaInO_3$ phase and a $(Ga, In)_2O_3$ phase is finely dispersed therein, as a crystal grain having an average particle diameter of equal to or smaller than 5 μm, and a content of gallium is equal to or higher than 10% by atom and below 25% by atom as atom number ratio of Ga/(In+Ga) or the like.

24 Claims, 2 Drawing Sheets

(56) References Cited

FOREIGN PATENT DOCUMENTS

| | | |
|---|---|---|
| JP | 09-050711 A | 2/1997 |
| JP | 09-259640 A | 10/1997 |
| JP | 10-025567 A | 1/1998 |
| JP | 2005-347215 A | 12/2005 |
| JP | 2007-113026 A | 5/2007 |
| WO | WO-03/014409 A1 | 2/2003 |
| WO | WO-2005122186 A1 | 12/2005 |

OXIDE SINTERED BODY AND PRODUCTION METHOD THEREFOR, TARGET, AND TRANSPARENT CONDUCTIVE FILM AND TRANSPARENT CONDUCTIVE SUBSTRATE OBTAINED BY USING THE SAME

This application is a Divisional application of U.S. application Ser. No. 12/452,063, which is now issued as U.S. Pat. No. 8,440,115, filed Dec. 14, 2009 which claims the right of priority under 35 U.S.C. §119 based on Japanese Patent Application No. 2007-178879 filed Jul. 6, 2007.

BACKGROUND OF THE INVENTION

1. Field of the Invention

The present invention relates to an oxide sintered body and a production method therefor, a target, and a transparent conductive film and a transparent conductive substrate obtained by using the same, and in more detail, the present invention relates to a target for sputtering or a tablet for ion plating, which enables to attain high rate film-formation and a nodule-less, an oxide sintered body suitable for obtaining the same and a production method therefor, and a transparent conductive film having low absorption of blue light and low specific resistance, obtained by using the same.

2. Description of the Prior Art

A transparent conductive film has high conductivity and high transmittance in a visible light region, therefore, has been utilized in an electrode or the like, for a solar cell or a liquid crystal display element, and other various light receiving elements, as well as a heat ray reflection film for an automotive window or construction use, an antistatic film, and a transparent heat generator for various anti-fogging for a refrigerator showcase and the like.

As a well known practical transparent conductive film, there has been included a thin film of tin oxide ($SnO_2$)-type, zinc oxide (ZnO)-type, indium oxide ($In_2O_3$)-type. As the tin oxide-type, one containing antimony as a dopant (ATO), or one containing fluorine as a dopant (FTO) has been utilized, and as the zinc oxide-type, one containing aluminum as a dopant (AZO), or one containing gallium as a dopant (GZO) has been utilized. However, the transparent conductive film most widely used industrially is the indium oxide-type. Among them, indium oxide containing tin as a dopant is called an ITO (Indium-Tin-Oxide) film, and has been utilized widely, because, in particular, a film with low resistance can be obtained easily.

The transparent conductive film with low resistance is suitably used widely in a surface element or a touch panel or the like, such as for a solar cell, a liquid crystal, an organic electroluminescence and an inorganic electroluminescence. As a production method for these transparent conductive films, a sputtering method or an ion plating method has been used often. In particular, a sputtering method is an effective method in film-formation of a material with low vapor pressure, or when control of precise film thickness is required, and because of very simple and easy operation thereof, it has been widely used industrially.

In a sputtering method, a target for sputtering is used as a raw material of a thin film. The target is a solid containing a metal element constituting the thin film to be formed, and a sintered body such as a metal, a metal oxide, a metal nitride, a metal carbide, or, in certain cases, a single crystal is used. In this method, in general, after making high vacuum once with a vacuuming apparatus, rare gas such as argon is introduced, and under a gas pressure of equal to or lower than about 10 Pa, a substrate is set as an anode and a target is set as a cathode to generate glow discharge between them and generate argon plasma, and argon cations in the plasma are collided with the target of the cathode, and particles of the target component flicked thereby are deposited on the substrate to form a film.

A sputtering method is classified by a generation method of argon plasma, and a method using high frequency plasma is called a high frequency sputtering method, and a method using direct-current plasma is called a direct-current sputtering method.

In general, a direct-current sputtering method has been utilized industrially in a wide range, because it provides higher film-formation rate and lower cost of power source facility and simpler film-formation operation, as compared with the high frequency sputtering method. However, the direct-current sputtering method has a disadvantage of requiring use of a conductive target, as compared with the high frequency sputtering method, which can provide film-formation even by using an insulating target.

Film-formation rate of a sputtering has close relation to chemical bond of a target substance. Because a sputtering is a phenomenon that argon cations having a kinetic energy are collided to the target surface, and a substance of a target surface is flicked by receiving energy, the weaker inter-ionic bond or inter-atomic bond of the target substance increases the more probability of jumping out by sputtering.

In film-formation of a transparent conductive film of an oxide such as ITO by using a sputtering method, there are a method for film-formation of an oxide film by a reactive sputtering method in mixed gas of argon and oxygen, by using an alloy target (an In—Sn alloy in the case of the ITO film) of metals constituting the film, and a method for film-formation of an oxide film by a reactive sputtering method for performing a sputtering in mixed gas of argon and oxygen, by using an oxide sintered body target (an In—Sn—O sintered body in the case of the ITO film) of elements constituting the film.

Among these, in a method for using the alloy target, relatively high amount of oxygen gas is supplied during sputtering, however, because dependence of film-formation rate or film characteristics (specific resistance, transmittance) on amount of oxygen gas to be introduced during film-formation is extremely high, it is difficult to produce stably transparent conductive film having a constant film thickness or characteristics.

In a method for using the oxide target, a part of oxygen to be supplied to a film is supplied from the target by sputtering, and residual deficient oxygen amount is supplied as oxygen gas. Therefore, dependence of film-formation rate or film characteristics (specific resistance, transmittance) on amount of oxygen gas to be introduced during film-formation is lower as compared with the case where the alloy target is used, and a transparent conductive film having a constant film thickness or characteristics can be produced more stably, and for this reason, a method for using the oxide target has been adopted industrially.

Under such background, in the case where mass production of film-formation of a transparent conductive film is performed by a sputtering method, a direct-current sputtering method used an oxide target is adopted in most cases. In consideration of productivity or production cost here, characteristics of the oxide target in direct-current sputtering becomes important. That is, the oxide target providing higher film-formation rate under the same charging power is useful. Further, because charging of the higher direct-current power increases film-formation rate the more, such an oxide target becomes useful industrially that is capable of providing film-formation stably, without generation of target crack or abnormal discharge such as arcing caused by nodule generation, even when high direct-current power is charged.

The nodule here indicates a black precipitate (a protrusion substance) generating at an erosion part of the target surface, excluding only a trace part at the deepest part of the erosion, when the target is being sputtered. In general, the nodule is said not to be a deposition of a foreign flying substance or a reaction product at the surface but a digging-residue left by sputtering. The nodule causes abnormal discharge such as arcing, therefore by reduction of the nodule, arcing is suppressed (refer to Non-Patent Document 1). Therefore, an oxide target which does not generate the nodule, that is, digging-residue left by sputtering, is suitable.

On the other hand, an ion plating method is a method where a metal or a metal oxide is evaporated by a resistance heating or electron beam heating, and further the evaporated substance is deposited onto a substrate after activation with plasma along with reactive gas (oxygen). Also as for a target for ion plating (which may be called a tablet or a pellet) to be used for formation of a transparent conductive film, similarly to a sputtering target, use of an oxide tablet is capable of producing more stably a transparent conductive film having constant film thickness and constant characteristics. The oxide tablet is required to evaporate uniformly, and it is preferable that a substance having stable chemical bond and difficult to be evaporated is not present together with a substance which is present as a main phase and easily evaporated.

As described hitherto, although ITO, which is formed by a direct-current sputtering method or an ion plating method, has been used industrially in a wide range, in a LED (Light Emitting Diode) or an organic EL (Electro Luminescence) whose progress has been significant in recent years, the cases have been emerged where characteristics not obtained by ITO is required. As one example, in a blue LED, it has been required a transparent conductive film with high transmittance of blue light of a wavelength of around 400 nm, to enhance light extraction efficiency. Light absorption of ITO in a visible region tends to increase more in the shorter wavelength region, in the order of red light, green light and blue light. Therefore, use of ITO as a transparent electrode of the blue LED results in loss by light absorption.

In order to avoid such a problem, in recent years, as an electrode of various light emission devices, there has been proposed a transparent conductive film composed of an oxide film containing indium and gallium, as an ITO-alternative transparent conductive film having low absorption of visible light, in particular, blue light. However, because of insufficient development of an oxide sintered body to be used as a target or a tablet, mass production of transparent conductive film having a good quality is not possible and thus practical applications have not yet been attained until now.

As for the transparent conductive film with low absorption of blue light, there has been proposed a transparent conductive material containing a gallium-indium oxide ($GaInO_3$) doped with small quantity of different-valent dopant such as a tetra-valent atom (for example, refer to Patent Document 1). In this Document, there has been described that a crystal film of said oxide exhibits excellent transparency and a low refractive index of about 1.6, which improves refractive index matching with a glass substrate, as well as enables to attain electric conductivity in the same degree as that of a wide forbidden band semiconductor to be used presently. And, there have been described that in a green or blue region, this film exhibits transmittance superior to an indium-tin oxide, and uniform and slight absorption over a visible spectra, and also a pellet of a raw material to be used in film-formation of said oxide, is a material with a single phase having a $GaInO_3$-type structure such as one represented as $GaIn_{1-x}M_xO_3$.

However, in the case where the material with a single phase having the $GaInO_3$-type structure is used as a target for a sputtering or a pellet for vapor deposition, sputtering yield is low and film-formation rate decreases extremely to about ½ of ITO, because said material with a single phase has a stable chemical bond, which is specific to a composite oxide, and thus it is disadvantageous industrially. In addition, there has been no study on a composition, a constitution or the like of an oxide sintered body, which makes possible suppression of nodule generation, which causes the above arcing, when condition to increase film-formation rate by increase in sputtering voltage or the like, is selected to overcome low sputtering yield. That is, as for the oxide sintered body as a raw material of the above transparent conductive film, there has been no consideration as far as an industrially practical aspect.

In addition, as a transparent conductive film and an oxide sintered body of the same oxide type as in the above Patent Document 1, there has been proposed a transparent conductive film having far higher conductivity than that of $GaInO_3$ or $In_2O_3$, that is, lower specific resistance and excellent optical characteristics, in a composition range different from conventionally known $GaInO_3$, and containing Ga content of from 15 to 49% by atom represented by Ga/(Ga+In), in a pseudo two-dimensional system represented by $Ga_2O_3$—$In_2O_3$ (for example, refer to Patent Document 2).

However, there is not so much detailed description on preparation condition of the oxide sintered body of a raw material for obtaining of the above transparent conductive film, and as for the constitution of the transparent conductive film, it is shown as an amorphous state or a microcrystalline state composed of a mixed phase such as $GaInO_3$, $GaInO_3$ and $In_2O_3$, $GaInO_3$ and $Ga_2O_3$, however, there is no description on the oxide sintered body of a raw material. Therefore, similarly as described above, as for the constitution of the oxide sintered body of a raw material, there has not been found any approach on an optimal state from an industrial or practical point of view, such as film-formation rate or suppression of a nodule.

Further, as a transparent conductive film of the same oxide type as in the above Patent Document 1, there has been proposed a transparent conductive film characterized by being composed of $In_2O_3$ with a Ga content of from 1 to 10% by atom (which may be referred to as an IGO film), and having lower specific resistance and higher transmittance as compared with a conventional ITO film (a transparent conductive film composed of $In_2O_3$ added with Sn), which is formed by a film-formation method such as a sputtering method, as a transparent conductive film which enables to correspond to, in particular, a large sized, colorized and highly accurate liquid crystal display (LCD) (for example, refer to Patent Document 3). There has been described that the IGO film having the above constitution has lower specific resistance, such as a specific resistance of equal to or lower than $1 \times 10^{-3}$ $\Omega$cm, even for a film formed at 100° C., as well as higher transmittance such as equal to or higher than 85% in a visible region, as compared with a conventional ITO film, therefore, it can be suitably used, in particular, as a transparent electrode of the LCD, and thus can attain high functionality and quality enhancement such as large sized, colorized and highly accurate tendency of LCD in the future. However, as a target to obtain the above transparent conductive film, there has been proposed only a composite target arranged with a Ga chip on an $In_2O_3$ target, or an $In_2O_3$ target containing predetermined quantity of Ga, and there has been no study on a constitution or the like of the oxide sintered body, thus it is not a approach on an optimal state from an industrial or practical point of view, such as film-formation rate or suppression of a nodule.

Under such circumstances, the present applicant has proposed a transparent conductive film of the same oxide type as in the above Patent Document, a sintered body target for production of a transparent conductive film, a transparent conductive substrate and a display device using the same (for example, refer to Patent Document 4). In this Document, there has been described, as for a structure of the oxide sintered body, that it is composed of Ga, In and O, and contains the above Ga from 35% by atom to 45% by atom, relative to total metal atoms, mainly composed of a $GaInO_3$ phase with a $\beta$-$Ga_2O_3$-type structure and an $In_2O_3$ phase with a bixbyite-type structure, and X-ray diffraction peak intensity ratio to a $\beta$-$GaInO_3$ phase (111) of an $In_2O_3$ phase (400) is from 50% to 110%, and density is equal to or higher than 5.8 g/cm$^3$. In addition, as for conductivity of the oxide sintered body, specific resistance is equal to or lower than $4.0 \times 10^{-2}$ $\Omega \cdot cm$, and in the case where it is over this level, film-formation rate decreases and productivity decreases, even when DC magnetron sputtering is possible.

In addition, as for a composition and a constitution structure of the above oxide sintered body, it is only considered influence on specific resistance or light transmittance of a transparent conductive film formed from this as a raw material, and the Ga content of below 35% by atom results in decrease in light transmittance in a shorter wavelength region of visible light, and the Ga content of over 45% by atom decreases conductivity. The specific resistance is required to be from $2 \times 10^{-3}$ $\Omega \cdot cm$ to $8.0 \times 10^{-3}$ $\Omega \cdot cm$, and although a region of the value below $1.2 \times 10^{-3}$ $\Omega \cdot cm$ is preferable, it requires for the composition of said transparent conductive film to have the Ga content of below 35% by atom. Accordingly, the optimal composition was selected in view of conductivity and optical characteristics of the obtained film, and there has not been studied on influence or the like of a composition and a constitution of the oxide sintered body on nodule generation, as a study item.

Under such circumstances, appearance of an oxide sintered body having indium and gallium has been desired, which has solved a practical problem such as high film-formation rate or nodule suppression that is important in mass production of a transparent conductive film containing indium and gallium, having low absorption of blue light and low resistance.

[Patent Document 1] JP-A-7-182924
[Patent Document 2] JP-A-9-259640
[Patent Document 3] JP-A-9-50711
[Patent Document 4] JP-A-2005-347215
[Non-Patent Document 1]"Technology of a transparent conductive film (the second Revised version)", Ohmsha, Ltd., published on Dec. 20, 2006, p. 238 to 239

SUMMARY OF THE INVENTION

It is an object of the present invention to provide a target for sputtering or a tablet for ion plating, which enables to attain high rate film-formation and a nodule-less, an oxide sintered body suitable for obtaining the same and a production method therefor, and a transparent conductive film having low absorption of blue light and low specific resistance obtained by using the same.

The present inventors have studied in detail on influence of the constitution phase and the constitution of an oxide sintered body composed of an oxide containing indium and gallium, on production condition such as film-formation rate of an oxide transparent conductive film, by a sputtering method with a target for sputtering or by an ion plating method with a tablet for ion plating, which uses said oxide sintered body as a raw material, along with on generation of a nodule causing arcing. As a result, the present inventors have found that in the oxide sintered body containing indium and gallium, when it satisfies that (1) it is constituted by substantially an $In_2O_3$ phase with a bixbyite-type structure having a solid solution of gallium, and a $GaInO_3$ phase of a $\beta$-$Ga_2O_3$-type structure constituted by indium and gallium, or an $In_2O_3$ phase with a bixbyite-type structure having a solid solution of gallium, and a $GaInO_3$ phase of a $\beta$-$Ga_2O_3$-type structure constituted by indium and gallium, and a $(Ga,In)_2O_3$ phase, and adjusting average particle diameter of a crystal grain composed of the $GaInO_3$ phase or the $GaInO_3$ phase and the $(Ga,In)_2O_3$ phase to equal to or smaller than 5 µm, and (2) a content of gallium in the oxide sintered body is adjusted to be equal to or higher than 10% by atom and below 35% by atom as atom number ratio of Ga/(In+Ga), a transparent conductive film having low absorption of blue light and low specific resistance, which makes possible suppression of nodule generation, which causes the above arcing, can be obtained, even when charge power is increased in formation of a transparent conductive film onto a substrate, for enhancement of film-formation rate, as well as when it satisfies that (3) the content of gallium is from 2 to 30% by atom as atom number ratio of Ga/(In+Ga+Sn+Ge), and the content of one or more kinds selected from tin or germanium is from 1 to 11% by atom as atom number ratio of (Sn+Ge)/(In+Ga+Sn+Ge), a transparent conductive film having low absorption of blue light and low specific resistance, which similarly makes possible suppression of nodule generation, which causes the above arcing, can be obtained, and have thus completed the present invention.

That is, according to a first aspect of the present invention, there is provided an oxide sintered body having indium and gallium as an oxide, characterized in that an $In_2O_3$ phase with a bixbyite-type structure is a major crystal phase, and a $GaInO_3$ phase of a $\beta$-$Ga_2O_3$-type structure, or a $GaInO_3$ phase and a $(Ga,In)_2O_3$ phase is finely dispersed therein as a crystal grain having an average particle diameter of equal to or smaller than 5 µm, and a content of gallium is equal to or higher than 10% by atom and below 35% by atom as atom number ratio of Ga/(In+Ga).

In addition, according to a second aspect of the present invention, there is provided the oxide sintered body in the first aspect, characterized in that the content of gallium is from 10 to 25% by atom as atom number ratio of Ga/(In+Ga).

In addition, according to a third aspect of the present invention, there is provided the oxide sintered body in the first or the second aspect, characterized in that intensity ratio of X-ray diffraction peaks defined by the following expression, is from 8% to 58%:

$$I[GaInO_3\ phase(111)]/\{I[In_2O_3\ phase(400)]+I[GaInO_3\ phase(111)]\} \times 100[\%]$$

(wherein I[$In_2O_3$ phase (400)] represents (400) peak intensity of the $In_2O_3$ phase with a bixbyite-type structure, and I[$GaInO_3$ phase (111)] represents (111) peak intensity of a composite oxide of $\beta$-$GaInO_3$ phase with a $\beta$-$Ga_2O_3$-type structure).

On the other hand, according to a fourth aspect of the present invention, there is provided an oxide sintered body having indium and gallium as an oxide, characterized in that an $In_2O_3$ phase with a bixbyite-type structure is a major crystal phase, and a $GaInO_3$ phase of a $\beta$-$Ga_2O_3$-type structure, or a $GaInO_3$ phase and a $(Ga,In)_2O_3$ phase is finely dispersed therein, as a crystal grain having an average particle diameter of equal to or smaller than 5 μm, and other than indium and gallium, further one or more kinds of additive components selected from tin or germanium are contained, and the content of gallium is from 2 to 30% by atom as atom number ratio of Ga/(In+Ga+Sn+Ge), and the content of the additive components is from 1 to 11% by atom as atom number ratio of (Sn+Ge)/(In+Ga+Sn+Ge).

Still more, according to a fifth aspect of the present invention, there is provided the oxide sintered body in the fourth aspect, characterized in that the content of gallium is from 2 to 20% by atom as atom number ratio of Ga/(In+Ga+Sn+Ge), and the content of one or more kinds selected from tin or germanium is from 2 to 10% by atom as atom number ratio of (Sn+Ge)/(In+Ga+Sn+Ge).

In addition, according to a sixth aspect of the present invention, there is provided the oxide sintered body in the fourth or fifth aspect, characterized in that intensity ratio of X-ray diffraction peaks, defined by the following expression, is from 4% to 84%.

$$I[GaInO_3 \text{ phase}(-111)]/\{I[In_2O_3 \text{ phase}(400)]+I[GaInO_3 \text{ phase}(-111)]\}\times 100[\%]$$

(wherein $I[In_2O_3$ phase (400)] represents (400) peak intensity of the $In_2O_3$ phase with a bixbyite-type structure, and $I[GaInO_3$ phase $(-111)]$ represents $(-111)$ peak intensity of a composite oxide of β-$GaInO_3$ phase with a β-$Ga_2O_3$-type structure).

In addition, according to a seventh aspect of the present invention, there is provided a production method for the oxide sintered body in any of the first to the sixth aspects, by mixing the raw material powders having indium oxide powders and gallium oxide powders, or by adding the tin oxide powders and/or germanium oxide powders into this raw material powders, and mixing the mixture, and then by compacting the mixed powders and sintering the compact by a normal pressure firing method, or by compacting and sintering the mixed powders by a hot press method, characterized by obtaining the oxide sintered body, where an $In_2O_3$ phase with a bixbyite-type structure is a major crystal phase, and a $GaInO_3$ phase, or a $GaInO_3$ phase and a $(Ga,In)_2O_3$ phase is finely dispersed therein, as a crystal grain having an average particle diameter of equal to or smaller than 5 μm, by adjusting the average particle diameter of the raw material powders to equal to or smaller than 1 μm.

In addition, according to an eighth aspect of the present invention, there is provided the production method for the oxide sintered body in the seventh aspect, characterized in that the compact is sintered at 1250 to 1450° C. for 10 to 30 hours in atmosphere of oxygen presence, by adoption of the normal pressure firing method.

In addition, according to a ninth aspect of the present invention, there is provided the production method for the oxide sintered body in the seventh aspect, characterized in that the compact is sintered at 1000 to 1200° C. for 10 to 30 hours in atmosphere of oxygen presence, by adoption of the normal pressure firing method.

In addition, according to a tenth aspect of the present invention, there is provided the production method for the oxide sintered body in the seventh aspect, characterized in that the mixed powders are compacted and sintered at 700 to 950° C. for 1 to 10 hours under a pressure of 2.45 to 29.40 MPa in inert gas atmosphere or in vacuum, by adoption of a hot press method.

On the other hand, according to a eleventh aspect of the present invention, there is provided a target obtained by processing the oxide sintered body in any of the first to the sixth aspects.

In addition, according to a twelfth aspect of the present invention, there is provided a target, characterized by obtaining by processing the oxide sintered body produced by the method in the eighth or the tenth aspect, wherein density of the oxide sintered body is equal to or higher than 6.3 g/cm³, and being used in formation of a transparent conductive film by a sputtering method.

In addition, according to a thirteenth aspect of the present invention, there is provided a target, characterized by obtaining by processing the oxide sintered body produced by the method in the ninth aspect, wherein density of the oxide sintered body is from 3.4 to 5.5 g/cm³, and being used in formation of a transparent conductive film by an ion plating method.

On the other hand, according to a fourteenth aspect of the present invention, there is provided an amorphous transparent conductive film obtained by using the target in any one of the eleventh to the thirteenth aspects, and by forming on a substrate, by a sputtering method or an ion plating method.

In addition, according to a fifteenth aspect of the present invention, there is provided the transparent conductive film in the fourteenth aspect, characterized in that the content of gallium in the film is equal to or higher than 10% by atom and below 35% by atom as atom number ratio of Ga/(In+Ga).

In addition, according to a sixteenth aspect of the present invention, there is provided the transparent conductive film in the fourteenth aspect, characterized in that the content of gallium in the film is from 2 to 30% by atom as atom number ratio of Ga/(In+Ga+Sn+Ge), and the content of one or more kinds selected from tin or germanium is from 1 to 11% by atom as atom number ratio of (Sn+Ge)/(In+Ga+Sn+Ge).

In addition, according to a seventeenth aspect of the present invention, there is provided the transparent conductive film in the fourteenth aspects, characterized in that the sputtering is performed under condition that arcing does not generate, even by charging a direct-current power density of 1.10 to 3.29 W/cm².

In addition, according to an eighteenth aspect of the present invention, there is provided the transparent conductive film in any one of the fourteenth to the fifteenth to seventeenth aspects, characterized in that arithmetic average height Ra is equal to or lower than 1.0 nm.

In addition, according to a nineteenth aspect of the present invention, there is provided the transparent conductive film in any one of the fourteenth to the eighteenth aspects, characterized in that extinction coefficient at a wavelength of 400 nm is equal to or smaller than 0.04.

In addition, according to a twentieth aspect of the present invention, there is provided the transparent conductive film in any one of the fourteenth to the nineteenth aspects, characterized in that specific resistance is equal to or lower than $2\times 10^{-3}$ Ω·cm.

On the other hand, according to a twenty-first aspect of the present invention, there is provided a transparent conductive substrate comprising by forming the transparent conductive film in any one of the fourteenth to the twentieth aspects, onto one surface or both surfaces of the transparent conductive substrate.

In addition, according to a twenty-second aspect of the present invention, there is provided the transparent conductive substrate in the twenty-first aspect, characterized in that a transparent substrate is any of a glass plate, a quartz plate, a resin plate or a resin film.

In addition, according to a twenty-third aspect of the present invention, there is provided the transparent conductive substrate in the twenty-second aspect, characterized in that the resin plate or the resin film is a single body made of polyethylene terephthalate, polyethersulfone, polyarylate or polycarbonate as a material, or a laminated structure body where surface thereof is covered with an acryl-based organic substance.

In addition, according to a twenty-fourth aspect of the present invention, there is provided. The transparent conductive substrate in the twenty-second or twenty-third aspect, characterized in that the resin plate or the resin film is covered with a gas barrier film at one surface or both surfaces thereof, or is a laminated body inserted with a gas barrier film at the intermediate part thereof.

Further, according to a twenty-fifth aspect of the present invention, there is provided the transparent conductive substrate in the twenty-fourth aspect, characterized in that the above gas barrier film is one or more kinds selected from a silicon oxide film, a silicon oxynitride film, a magnesium aluminate film, a tin oxide-based film, or a diamond-like carbon film.

The oxide sintered body composed of indium and gallium of the present invention, when it satisfies that an $In_2O_3$ phase with a bixbyite-type structure is a major crystal phase, and a $GaInO_3$ phase of a $\beta$-$Ga_2O_3$-type structure, or $GaInO_3$ phase and a $(Ga,In)_2O_3$ phase is finely dispersed therein as a crystal grain having an average particle diameter of equal to or smaller than 5 μm, and a content of gallium in the oxide sintered body is equal to or higher than 10% by atom and below 35% by atom as atom number ratio of Ga/(In+Ga), or the content of gallium is from 2 to 30% by atom as atom number ratio of Ga/(In+Ga+Sn+Ge), and the content of one or more kinds selected from tin or germanium is from 1 to 11% by atom as atom number ratio of (Sn+Ge)/(In+Ga+Sn+Ge), can suppress nodule generation, which causes arcing, even when film-formation rate is increased in obtaining an oxide transparent conductive film by a sputtering method or an ion plating method, and as a result, can obtain a transparent conductive film containing indium and gallium, having low absorption of blue light and low specific resistance, therefore, it is extremely useful industrially.

DETAILED DESCRIPTION OF THE INVENTION

Figure 1:
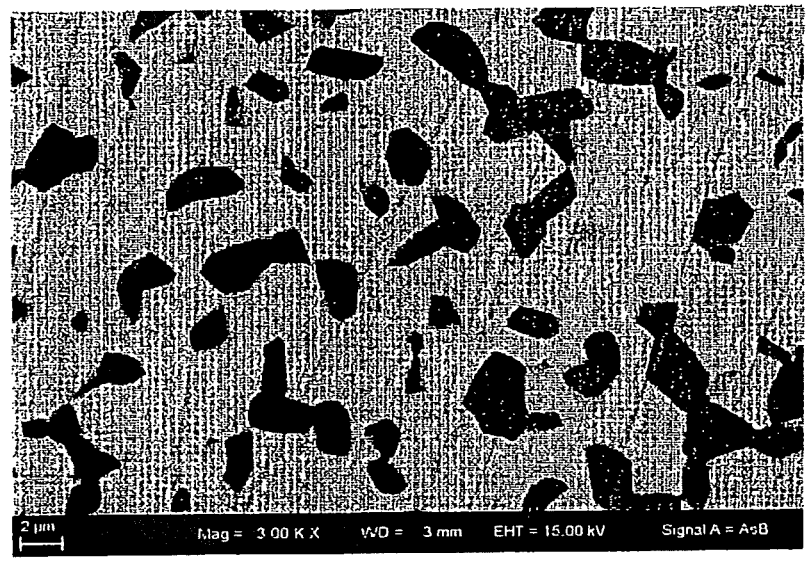
FIG. 1 is a SEM image of the oxide sintered body of the present invention, observed with a scanning electron microscope (SEM).

Explanation will be given below in detail on an oxide sintered body and a production method thereof, a target and a transparent conductive film obtained by using the same, and a transparent conductive substrate of the present invention.

1. An Oxide Sintered Body

Up to now, there has been proposed a target for sputtering or a tablet for ion plating of a transparent conductive film composed of an oxide containing indium and gallium, however, as for an oxide sintered body as a raw material thereof, there has not been studied sufficiently on optimization of production condition for obtaining an oxide transparent conductive film by a sputtering method or an ion plating method, and the constitution phase and the constitution of the oxide sintered body. In the present invention, there has been clarified influence of the constitution phase and the constitution of an oxide sintered body, on film-formation rate and generation of a nodule causing arcing.

In the present invention, there are two kinds in the oxide sintered body containing indium and gallium as oxides: one having a specific phase structure, where a content of gallium is equal to or higher than 10% by atom and below 35% by atom as atom number ratio of Ga/(In+Ga) (hereafter, this is referred to as a first oxide sintered body), and one where, other than indium and gallium, further one or more kinds selected from tin or germanium are contained, and the content of gallium is from 2 to 30% by atom as atom number ratio of Ga/(In+Ga+Sn+Ge), and one or more kinds selected from tin or germanium is from 1 to 11% by atom as atom number ratio of (Sn+Ge)/(In+Ga+Sn+Ge) (hereafter, this is referred to as a second oxide sintered body).

(I) the First Oxide Sintered Body

The first oxide sintered body of the present invention is characterized in that, in the oxide sintered body having indium and gallium as an oxide, an $In_2O_3$ phase with a bixbyite-type structure described in a JCPDS card 06-0416 is a major crystal phase, and a $GaInO_3$ phase of a $\beta$-$Ga_2O_3$-type structure described in a JCPDS card 21-0334, or $GaInO_3$ phase and a $(Ga,In)_2O_3$ phase described in a JCPDS card 14-0564, is finely dispersed therein as a crystal grain having an average particle diameter of equal to or smaller than 5 μm, and a content of gallium is equal to or higher than 10% by atom and below 35% by atom as atom number ratio of Ga/(In+Ga).

(a) Composition and Oxide Sintered Body Constitution

In the present invention, composition of the first oxide sintered body is required that the content of gallium is equal to or higher than 10% by atom and below 35% by atom as atom number ratio of Ga/(In+Ga), for the transparent conductive film to be obtained by a sputtering method or an ion plating method by using said oxide sintered body, to exhibit low absorption of blue light and low resistance.

It is required not only that the oxide sintered body is within the above composition range but also the sintered body constitution has an $In_2O_3$ phase with a bixbyite-type structure as a major crystal phase, and a $GaInO_3$ phase of a $\beta$-$Ga_2O_3$-type structure, or $GaInO_3$ phase and a $(Ga,In)_2O_3$ phase is finely dispersed therein, as a crystal grain having an average particle diameter of equal to or smaller than 5 μm.

In the above $In_2O_3$ phase with a bixbyite-type structure having a solid solution of gallium, and the $GaInO_3$ phase of a $\beta$-$Ga_2O_3$-type structure constituted by indium and gallium, and the $(Ga,In)_2O_3$ phase, a part of indium may be substituted with gallium, or a part of gallium may be substituted with indium, or a certain degree of gap from stoichiometric composition or deficit of a metal element or oxygen deficit may be included. It should be noted that the $(Ga,In)_2O_3$ phase is a phase formed at a high sintering temperature of equal to or higher than 1500° C. in normal pressure sintering. $(Ga,In)_2O_3$ phase raises no problem, as long as it is in small quantity, although it provides a little higher electric resistance and a little lower film-formation rate as compared with the $GaInO_3$ phase.

However, presence of too high quantity raises a problem of decrease in film-formation rate or decrease in productivity or the like. In order to decrease absorption of blue light of a transparent conductive film, as described also in the above Patent Document 1, inclusion of the $GaInO_3$ phase of a $\beta$-$Ga_2O_3$-type structure constituted by indium and gallium, in the oxide sintered body to be used as a target for obtaining the transparent conductive film is required, and still more the $(Ga,In)_2O_3$ phase may be contained.

In addition, as described above, because the first oxide sintered body of the present invention has the $In_2O_3$ phase with a bixbyite-type structure having a solid solution of gallium as a major phase, and the $GaInO_3$ phase of a $\beta$-$Ga_2O_3$-type structure constituted by indium and gallium is less, it is characterized in that intensity ratio of X-ray diffraction peaks defined by the following expression (1), is from 8% to 58%. The intensity ratio of X-ray diffraction peaks of below 8% decreases excessively the $GaInO_3$ phase in the oxide sintered body, resulting in too high absorption of blue light by the transparent conductive film, on the other hand, the intensity ratio of X-ray diffraction peaks of over 58% raises a problem of excessive increase in specific resistance of the transparent conductive film formed, or frequent generation of arcing in sputtering, and thus not preferable.

$$I[GaInO_3 \text{ phase}(111)]/\{I[In_2O_3 \text{ phase}(400)]+I[GaInO_3 \text{ phase}(111)]\} \times 100 [\%]$$

(wherein $I[In_2O_3$ phase (400)] represents (400) peak intensity of the $In_2O_3$ phase with a bixbyite-type structure, and $I[GaInO_3$ phase (111)] represents (111) peak intensity of a composite oxide of $\beta$-$GaInO_3$ phase with a $\beta$-$Ga_2O_3$-type structure).

(b) Content of Gallium

In the first oxide sintered body, the content of gallium is equal to or higher than 10% by atom and below 35% by atom as atom number ratio of Ga/(In+Ga).

In the case where the gallium content is below 10% by atom as atom number ratio of Ga/(In+Ga), most of the oxide sintered body is constituted by only the $InO_3$ phase with a bixbyite-type structure, where gallium is present as a solid solution. Therefore, that case does not contain the above composite oxide phase, and thus can not form the transparent conductive film having the above optical characteristics.

On the other hand, in the case where the gallium content is over 35% by atom as atom number ratio of Ga/(In+Ga), ratio of the $GaInO_3$ phase of a $\beta$-$Ga_2O_3$-type structure constituted by indium and gallium and the $(Ga,In)_2O_3$ phase in the oxide sintered body are included, however, this ratio increases inevitably, and mainly the above two phases are present, where the $In_2O_3$ phase with a bixbyite-type structure having gallium as a solid solution becomes to be present inevitably. Such an oxide sintered body is equivalent to a conventional one of the Patent Document 4, which increases the $GaInO_3$ phase with a $\beta$-$Ga_2O_3$-type structure or the $(Ga,In)_2O_3$ phase having low film-formation rate in a sputtering method or the like, therefore decreases inevitably film-formation rate and decreases industrial production efficiency. In addition, it is difficult that specific resistance of the transparent conductive film to be formed exhibits equal to or lower than $2\times10^{-3}$ $\Omega\cdot cm$, and still more it is far more difficult to attain the level of $10^{-4}$ $\Omega\cdot cm$, which is a practical target of the present invention.

(c) A Sintered Body Constitution and a Nodule

In the case where the oxide sintered body of the present invention is processed, for example, as a target for direct-current sputtering, crystal grains of the $In_2O_3$ phase and the $GaInO_3$ phase, and/or the $(Ga,In)_2O_3$ phase are present at the target surface, however, in comparison based on volume ratio, when content of gallium in the oxide sintered body is equal to or higher than 10% by atom and below 35% by atom as atom number ratio of Ga/(In+Ga), volume ratio of the crystal grains of the $In_2O_3$ phase increase, as described above. Such a target usually never generates a nodule at the target surface. However, even when an oxide sintered body has indium and gallium within the above composition, a problem of nodule generation at the target surface may happen in some cases.

It is the case where the $GaInO_3$ phase along with the $(Ga,In)_2O_3$ phase are present in a large quantity. The $GaInO_3$ phase along with the $(Ga,In)_2O_3$ phase provide higher electric resistance as compared with the $In_2O_3$ phase, and are difficult to be sputtered, due to having a strong chemical bond, which is specific to a composite oxide. An oxide sintered body of general ITO is constituted by coarse crystal grains of the $In_2O_3$ phase, with an average particle diameter of about 10 μm, however, in the case where the oxide sintered body containing indium and gallium in the above composition range is constituted by the coarse crystal grains similarly as in ITO, the grains of the $In_2O_3$ phase are sputtered preferentially, on the other hand, sputtering of the crystal grains of the $GaInO_3$ phase, or the $GaInO_3$ phase and the $(Ga,In)_2O_3$ phase does not progress, and thus the coarse crystal grains of the $GaInO_3$ phase, or the $GaInO_3$ phase and the $(Ga,In)_2O_3$ phase remain inevitably, at the target surface without being dug out. Starting from these digging-residue points, a nodule tends to grow gradually, by which abnormal discharge such as arcing is inevitably generated frequently.

In order to suppress the above digging-residue, that is a nodule, it is required to attain a structural refinement of the oxide sintered body containing indium and gallium within the above composition range. That is, it is effective that the crystal grain of $GaInO_3$ phase, or the $GaInO_3$ phase and the $(Ga,In)_2O_3$ phase in said oxide sintered body is finely dispersed. To begin with, because the $GaInO_3$ phase along with the $(Ga,In)_2O_3$ phase are conductive bodies, they themselves do not cause abnormal discharge themselves, and finer dispersion thereof makes difficult for them to become starting points of nodule growth.

FIG. 1 shows a SEM image of the oxide sintered body of the present invention, observed with a scanning electron microscope (SEM) of the oxide sintered body containing of gallium in 20% by atom as atom number ratio of Ga/(In+Ga), as an example of finely dispersed crystal grains of the $GaInO_3$ phase, or the $GaInO_3$ phase and the $(Ga,In)_2O_3$ phase. Irregular-shaped black particles are dotted with in a white matrix. As a result of EDS (Energy Dispersive Spectroscopy) analysis, it have been found that the black crystal grains are the $GaInO_3$ phase, or the $GaInO_3$ phase and the $(Ga,In)_2O_3$ phase, and surrounding white crystal grains are crystal grains of the $In_2O_3$ phase. The crystal grains of the $GaInO_3$ phase, or the $GaInO_3$ phase and the $(Ga,In)_2O_3$ phase have an average particle diameter of equal to or smaller than 5 μm, and in addition, use of a target obtained by processing this oxide sintered body seldom generated a nodule starting from the digging-residue. From this fact, it is clear that, a constitution of the $In_2O_3$ phase finely dispersed with the $GaInO_3$ phase, as shown in FIG. 1, is effective in suppression of a nodule in sputtering.

Therefore, in order to suppress a nodule, it is required that average particle diameter of the crystal grains composed of the $GaInO_3$ phase, or the $GaInO_3$ phase and the $(Ga,In)_2O_3$ phase is equal to or smaller than 5 μm. Still more it is preferable to be controlled at equal to or smaller than 3 μm. It should be noted that the gallium content in the oxide sintered body of below 10% by atom provides, as described above, a single $In_2O_3$ phase structure, therefore a nodule suppression method by fine dispersion of the a crystal grains of the $GaInO_3$ phase, or the $GaInO_3$ phase and the $(Ga,In)_2O_3$ phase of the present invention is not effective.

In this way, a dispersion state of the $GaInO_3$ phase, or the $GaInO_3$ phase and the $(Ga,In)_2O_3$ phase in the oxide sintered body is specified, as well as constitution ratio to the $In_2O_3$ phase is also specified. Constitution ratio of the $In_2O_3$ phase of main phase and the $GaInO_3$ phase of dispersed phase in the oxide sintered body of the present invention is from 8% to 58% as intensity ratio of X-ray diffraction peaks defined by the above expression (1). On the contrary, in Patent Document 4 by the present applicant, gallium content of a sintered body target for production of the transparent conductive film is from 35% by atom to 45% by atom as atom number ratio of Ga/(In+Ga)), and the composition range is different from that of the present invention, however, it has been described that intensity ratio of X-ray diffraction peaks defined by the following expression (2) is from 50% to 110%, that is, from 48% to 67% when converted to intensity ratio of X-ray diffraction peaks defined by the above expression (1), and thus the range of the intensity ratio of X-ray diffraction peaks is partially overlapped with the present invention. This is estimated to be influenced mainly by difference of particle diameter or dispersing property of the $GaInO_3$ phase generated by difference of average particle diameter of raw material powders, and difference of diffusion behavior in a sintering reaction.

$$I[In_2O_3\ phase(400)]/I[GaInO_3\ phase(111)] \times 100[\%] \quad (2)$$

(wherein $I[In_2O_3$ phase (400)] represents (400) peak intensity of the $In_2O_3$ phase with a bixbyite-type structure, and $I[GaInO_3$ phase (111)] represents (111) peak intensity of a composite oxide of $\beta$-$GaInO_3$ phase with a $\beta$-$Ga_2O_3$-type structure).

In general, by subjecting the crystal grains constituting an oxide sintered body to refinement, strength enhancement is attained. In the present invention as well, because of having the above sintered body constitution, the oxide sintered body becomes difficult to be fractured, even in receiving of impact by heat or the like, caused by increased direct-current power charge.

(II) A Second Oxide Sintered Body

In addition, the second oxide sintered body of the present invention is an oxide sintered body containing indium and gallium as an oxide, characterized in that an $In_2O_3$ phase with a bixbyite-type structure is a major crystal phase, and a $GaInO_3$ phase of a $\beta$-$Ga_2O_3$-type structure, or a $GaInO_3$ phase and a $(Ga,In)_2O_3$ phase is finely dispersed therein, as a crystal grain having an average particle diameter of equal to or smaller than 5 μm, and other than indium and gallium, further one or more kinds of additive components selected from tin or germanium are contained, and the content of gallium is from 2 to 30% by atom as atom number ratio of Ga/(In+Ga+Sn+Ge), and the content of the additive components is from 1 to 11% by atom as atom number ratio of (Sn+Ge)/(In+Ga+Sn+Ge).

That is, in the present invention, in the oxide sintered body containing indium and gallium, further one or more kinds of additive components may be included, which are selected from tin, germanium, silicon, niobium, titanium, zirconium, hafnium, cerium, molybdenum or tungsten. The most effective ones as the additive components are tin and germanium. Content of the additive components is not especially limited, however, it is preferably from 1 to 11% by atom as atom number ratio of (Sn+Ge)/(In+Ga+Sn+Ge). More preferable content of the additive components is 2 to 10% by atom.

In the case when the oxide sintered body contains one or more kinds of additive components selected from tin or germanium, not only specific resistance of the oxide sintered body decreases and film-formation rate enhances but also specific resistance of the transparent conductive film formed decreases more. In this case, the content of one or more kinds selected from tin or germanium is below 1% by atom as atom number ratio of (Sn+Ge)/(In+Ga+Sn+Ge) does not provide such effect, while the content over 11% by atom may impair the object of the present invention instead. It should be noted that, in consideration of making specific resistance of the transparent conductive film formed lower, it is preferable that the content of one or more kinds selected from tin or germanium is from 2 to 10% by atom as atom number ratio of (Sn+Ge)/(In+Ga+Sn+Ge). In addition, in the case where decrease in absorption at a short wavelength side of a visible region, that is, blue light, under industrially useful condition of film-formation at low temperature, is required, the addition of one or more kinds selected from tin and germanium may impair the above characteristic in some cases. The reason is considered because a part of the one or more kinds selected from tin and germanium of an amorphous film formed, may be converted in some cases to SnO and GeO having high light absorption, in the case of film-formation at low temperature. In the case where one or more kinds selected from tin and germanium are contained in a range of the above atom ratio, it is preferable that the content of gallium is from 2 to 30% by atom as atom number ratio of Ga/(In+Ga+Sn+Ge). More preferable content of gallium is from 2 to 20% by atom. Reason for including lower Ga atom ratio in the composition range of the present invention, as compared with the case of not containing tin and germanium, is because the above $GaInO_3$ phase and $(Ga,In)_2O_3$ phase are formed in a larger quantity, even under the same Ga atom ratio, in the case where tin and germanium are contained. The case of lower Ga atom ratio than this range is not preferable, because the oxide sintered body is constituted by only the $In_2O_3$ phase with a bixbyite-type structure, where gallium is present as a solid solution, similarly as in the above case of no inclusion of tin and germanium. On the other hand, in the case where the ratio is over this range, the $GaInO_3$ phase, or the $GaInO_3$ phase and a $(Ga,In)_2O_3$ phase becomes a major phase, and the $In_2O_3$ phase becomes a dispersed phase. When it is used as, for example, a sputtering target in film-formation, it never raises an outstanding nodule problem originally. In addition, not only film-formation rate decreases but also showing of decreased specific resistance of the transparent conductive film formed becomes difficult.

In addition, in the case where the one or more kinds selected from tin or germanium are contained within the above atom ratio range, that is, also in the second oxide sintered body similarly as in the first oxide sintered body, the $In_2O_3$ phase with a bixbyite-type structure, where gallium is present as a solid solution, is set to be a major phase, and the $GaInO_3$ phase of a $\beta$-$Ga_2O_3$-type structure, constituted by indium and gallium, is set to be a dispersed phase. However, a different point from the first oxide sintered body is that, by the addition of one or more kinds selected from tin and germanium, orientation tendency generates in the $GaInO_3$ phase. Therefore, it is preferable that intensity ratio of X-ray diffraction peaks is defined by the following expression (3), not by the above expression (1). In this case, intensity ratio of X-ray diffraction peaks defined by the following expression (3), is preferably from 4% to 84%:

$$I[GaInO_3\ phase(-111)]/\{I[In_2O_3\ phase(400)]+I[GaInO_3\ phase\ (-111)]\} \times 100[\%] \quad (3)$$

(wherein $I[In_2O_3$ phase (400)] represents (400) peak intensity of the $In_2O_3$ phase with a bixbyite-type structure, and $I[GaInO_3$ phase (−111)] represents (−111) peak intensity of a composite oxide of ($\beta$-$GaInO_3$ phase with a $\beta$-$Ga_2O_3$-type structure).

In the second oxide sintered body, it is estimated that orientation tendency generates such that the (−111) plane grows preferentially, because of presence of a solid solution of one or more kinds selected from tin and germanium in the $GaInO_3$ phase. Because of orientation tendency, range of value taken by the intensity ratio of X-ray diffraction peaks defined by the expression (3), becomes apparently wider than that of the above expression (1). It should be noted that the intensity ratio of X-ray diffraction peaks of below 4% provides too low $GaInO_3$ phase in the oxide sintered body, and too high absorption of blue light by the transparent conductive film, while the ratio of over 84% raises a problem of too high increase in specific resistance of the transparent conductive film formed, or frequent occurrence of arcing in sputtering, and thus not preferable. In addition, in order to suppress a nodule, also as for the second oxide sintered body, it is required that average particle diameter of the crystal grain composed of the $GaInO_3$ phase, or the $GaInO_3$ phase and the $(Ga,In)_2O_3$ phase is equal to or smaller than 5 μm, and more preferably it is controlled at equal to or smaller than 3 μm, in the same way as in the first oxide sintered body.

It should be noted that, by the addition of one or more kinds selected from tin and germanium, a different composite oxide phase may generate to some extent in some cases. For example, there is included a composite oxide phase of a tetragonal crystal system, represented by the general formula of $Ga_{3-x}In_{5+x}Sn_2O_{16}$ (0.3<x<1.5), such as a $Ga_{2.4}In_{5.6}Sn_2O_{16}$ phase described in a JCPDS card 51-0204, a $Ga_2In_6Sn_2O_{16}$ phase described in a JCPDS card 51-0205, or a $Ga_{1.6}In_{6.4}Sn_2O_{16}$ phase described in a JCPDS card 51-0206. These composite oxide phases have equivalent characteristics to the $GaInO_3$ phase, although various characteristics such as conductivity are inferior to the $In_2O_3$ phase, therefore, dispersion of these phases in certain quantity in the oxide sintered body raises no problem in film-formation such as sputtering. In addition, there is no problem raised, because equivalent various characteristics are shown by the transparent conductive film formed. Naturally, it is required for average particle diameter of crystal grains of these composite oxide phases in the oxide sintered body to be equal to or smaller than 5 μm, in the same way as in the $GaInO_3$ phase, and more preferably it is controlled at smaller than 3 μm, for suppression of a nodule.

In addition, it is desirable that the oxide sintered body of the present invention does not contain Zn substantially. It is because inclusion of zinc inevitably increases absorption of visible light of the transparent conductive film to be formed by using this as a raw material. The reason is considered to be derived from the presence of zinc in a metal-like state in the transparent conductive film, in film-formation at low temperature.

It should be noted that, although description was made on tin, germanium and zinc, in addition to these, for example, silicon, niobium, titanium, zirconium, hafnium, cerium, molybdenum, tungsten, still more iridium, ruthenium, rhenium and the like may be contained as impurity elements.

2. A Production Method for the Oxide Sintered Body

The production method for the oxide sintered body of the present invention is a method by mixing the raw material powders containing indium oxide powders and gallium oxide powders, or by adding the tin oxide powders and/or germanium oxide powders into this raw material powders, and mixing, and then by compacting the mixed powders and sintering the compact by a normal pressure firing method, or by compacting and sintering the mixed powders by a hot press method, characterized by obtaining of the oxide sintered body, where the $In_2O_3$ phase with a bixbyite-type structure becomes a major crystal phase, and the crystal grain composed of the $GaInO_3$ phase, or the $GaInO_3$ phase and the $(Ga,In)_2O_3$ phase is finely dispersed therein, having an average particle diameter of equal to or smaller than 5 μm, by adjusting the average particle diameter of the raw material powders to equal to or smaller than 1 μm.

That is, performance of the oxide sintered body having the above phase constitution and a composition of each phase largely depends on production condition of the oxide sintered body, for example, particle diameter of raw material powders, mixing condition and firing condition.

It is required that the oxide sintered body of the present invention uses indium oxide powders and gallium oxide powders which are adjusted to have an average particle diameter of equal to or smaller than 1 μm, as raw material powders. As the constitutions of oxide sintered body of the present invention, it is preferable that the $In_2O_3$ phase is the main phase, and the constitution where average particle diameter of the crystal grains composed of the $GaInO_3$ phase, or the $GaInO_3$ phase and the $(Ga,In)_2O_3$ phase is equal to or smaller than 5 μm is present together. The constitution is more preferable that the crystal grains composed of the $GaInO_3$ phase, or the $GaInO_3$ phase and the $(Ga,In)_2O_3$ phase is finely dispersed in the main phase, and an average particle diameter is equal to or smaller than 3 μm. It should be noted that certain separate composite oxides, which may generate in the second oxide sintered body, for example, a $Ga_{2.4}In_{5.6}Sn_2O_{16}$ phase, a $Ga_2In_6Sn_2O_{16}$ phase and a $Ga_{1.6}In_{6.4}Sn_2O_{16}$ phase or the like are preferably the same fine constitutions.

In order to form such fine constitutions, it is required for average particle diameter of raw material powders to be adjusted to equal to or smaller than 1 μm. Use of indium oxide powders and gallium oxide powders having the average particle diameter of over 1 μm as raw material powders, inevitably increases average particle diameter of crystal grains composed of the $GaInO_3$ phase, or the $GaInO_3$ phase and the $(Ga,In)_2O_3$ phase, which are present with the $In_2O_3$ phase as a main phase in the obtained oxide sintered body, to over 5 μm. As described above, large crystal grains of the $GaInO_3$ phase, or the $GaInO_3$ phase and the $(Ga,In)_2O_3$ phase, with the average particle diameter of over 5 μm, are difficult to be sputtered, and by continuing the sputtering, become relatively large residue at the target surface, which becomes a starting point of a nodule, causing abnormal discharge such as arcing. In the above Patent Document 4, although presence of the crystal grains composed of the $GaInO_3$ phase, or the $GaInO_3$ phase and the $(Ga,In)_2O_3$ phase has been shown, however, relationship between the crystal grain constitutions and nodule suppression has not been noticed.

Indium oxide powders are raw materials of ITO (indium-tin oxide), and development of fine indium oxide powders having excellent sintering property, has been progressed with improvement of ITO. And, the raw material powders with an average particle diameter of equal to or smaller than 1 μm, are easily available, due to use in a large quantity at present, as raw materials of ITO. However, in the case of gallium oxide powders, raw material powders with an average particle diameter of equal to or smaller than 1 μm are not easily available, due to smaller use quantity as compared with indium oxide powders. Therefore the coarse gallium oxide powders are required to be crushed to an average particle diameter of equal to or smaller than 1 μm. In addition, tin oxide powders and germanium oxide powders to be added for obtaining of the second oxide sintered body, are in a similar situation as each of the cases of the indium oxide powders and the gallium oxide powders, and the germanium oxide powders are required to be crushed from coarse powders to an average particle diameter of equal to or smaller than 1 μm.

In order to obtain the oxide sintered body of the present invention, after mixing the raw material powders containing indium oxide powders and gallium oxide powders, the mixed powder are compacted and the compact is sintered by a normal pressure firing method, or the mixed powders are compacted and sintered by a hot press method. The normal pressure firing method is a simple and convenient, and industrially advantageous method, and thus a preferable method, however, a hot press method may be used as well, if necessary.

In the case where the normal pressure firing method is used, a compact is prepared first. Raw material powders are charged into a resin pot for mixing along with a binder (for example, PVA) or the like, by using a wet-type ball mill or the like. In order to obtain the oxide sintered body of the present invention, where average particle diameter of crystal grains composed of the $GaInO_3$ phase, or the $GaInO_3$ phase and the $(Ga,In)_2O_3$ phase, which are present with the $In_2O_3$ phase as a main phase, is equal to or smaller than 5 μm, and the crystal grains are finely dispersed, it is preferable that the above ball mill mixing is performed for equal to or longer than 18 hours. In this case, as a ball for mixing, a hard-type $ZrO_2$ ball may be used. After the mixing, slurry is taken out for performing of filtration, drying and granulation. After that, the obtained granulated substances are compacted, under a pressure of from about 9.8 MPa (0.1 ton/cm$^2$) to 294 MPa (3 ton/cm$^2$), by using a cold isostatic press to obtain a compact.

In a sintering step of the normal pressure firing method, heating is performed at a predetermined temperature range under atmosphere of oxygen presence. The temperature range is determined whether the sintered body is used for sputtering or for ion plating. In the case of use for sputtering, sintering is performed at 1250 to 1450° C., more preferably at 1300 to 1400° C., under atmosphere where oxygen gas is introduced into air inside a sintering furnace. Sintering time is preferably from 10 to 30 hours, and more preferably from 15 to 25 hours.

On the other hand, in the case of use for ion plating, a compact is sintered at 1000 to 1200° C., for 10 to 30 hours under atmosphere of oxygen presence, preferably at 1000 to 1100° C., under atmosphere where oxygen gas is introduced into air inside a sintering furnace. Sintering time is preferably from 15 to 25 hours.

By using the indium oxide powders and gallium oxide powders, which are adjusted to have the above average particle diameter of equal to or smaller than 1 μm, and at the sintering temperature of the above range, as raw material powders, it is possible to obtain a dense oxide sintered body, where the crystal grains composed of the $GaInO_3$ phase, or the $GaInO_3$ phase and the $(Ga,In)_2O_3$ phase having an average particle diameter of equal to or smaller than 5 μm, more preferably equal to or smaller than 3 μm, are finely dispersed in the $In_2O_3$ phase matrix.

The too low sintering temperature does not progress a sintering reaction sufficiently. In particular, in order to obtain the oxide sintered body with a density of equal to or higher than 6.0 g/cm$^3$, the temperature is preferably equal to or higher than 1250° C. On the other hand, the sintering temperature over 1450° C. extremely increases formation of the $(Ga,In)_2O_3$ phase, decreases volume ratio of the $In_2O_3$ phase and the $GaInO_3$ phase, which makes difficult control of the oxide sintered body to the above finely dispersed constitution.

Sintering atmosphere is preferably atmosphere in the presence of oxygen, and still more preferably atmosphere where oxygen gas is introduced into air inside the sintering furnace. Presence of oxygen in sintering enables to make higher density of the oxide sintered body. In raising a temperature to sintering temperature, in order to prevent cracking of a sintered body and progress de-binder, it is preferable to set temperature increasing rate in a range of from 0.2 to 5° C./min. In addition, if necessary, different temperature increasing rates may be combined to raise temperature up to sintering temperature. In the step for increasing temperature, specific temperature may be held for a certain period aiming at progressing of de-binder or sintering. In cooling after sintering, it is preferable to stop introduction of oxygen, and lower temperature down to 1000° C. at temperature decreasing rate in a range of from 0.2 to 5° C./min, in particular, equal to or higher than 0.2° C./min and lower than 1° C./min.

In the present invention, in the case where a hot press method is adopted, the mixed powders are compacted and sintered at 700 to 950° C. for 1 to 10 hours under a pressure of 2.45 to 29.40 MPa in inert gas atmosphere or in vacuum. The hot press method can decrease the oxygen content in the sintered body, due to subjecting raw material powders of the oxide sintered body to compacting and sintering under reducing atmosphere, as compared with the above normal pressure firing method. However, caution is required at a high temperature of over 950° C., because of reduction of indium oxide and melting as metal indium.

One Example of production condition of the oxide sintered body by the hot press method of the present invention is shown. That is, indium oxide powders with an average particle diameter of equal to or smaller than 1 μm, along with gallium oxide powders with an average particle diameter of equal to or smaller than fpm, or still more tin oxide powders with an average particle diameter of equal to or smaller than 1 μm, or germanium oxide powders with an average particle diameter of equal to or smaller than 1 μm are prepared, as raw material powders, so as to be predetermined ratio.

The prepared raw materials are sufficiently mixed similarly as in ball mill mixing of a normal pressure firing method, preferably for a mixing time of equal to or longer than 10 hours, to obtain granulated substance. Then the granulated mixed powders are supplied into a carbon container to be subjected to sintering by the hot press method. Sintering temperature may be set at from 700 to 950° C., pressure may be set at from 2.45 MPa to 29.40 MPa (25 to 300 kgf/cm$^2$), and sintering time may be set from about 1 to 10 hours. Atmosphere during hot press is preferably in inert gas such as Ar, or in vacuum.

In the case of obtaining a target for sputtering, more preferably, sintering temperature may be set at from 800 to 900° C., pressure may be at from 9.80 MPa to 29.40 MPa (100 to 300 kgf/cm$^2$), and sintering time may be from 1 to 3 hours. In addition, in the case of obtaining a target for ion plating, more preferably, sintering temperature may be set at from 700 to 800° C., pressure may be at from 2.45 MPa to 9.80 MPa (25 to 100 kgf/cm$^2$), and sintering time may be from 1 to 3 hours.

It should be noted that, in Patent Document 2, there has been described, on preparation condition of the oxide sintered body, that each powders of $Ga_2O_3$ and $In_2O_3$ were mixed uniformly in a molar fraction of 33.0 and 67% by mol, respectively, and then fired at 1000° C. for 5 hours in argon (Example 1). However, there has been no description on average particle diameter of powders of $Ga_2O_3$ and $In_2O_3$, and firing was performed at relatively low temperature of 1000° C. Because a target produced in this way has low density due to no progress of sintering, arcing generates frequently in charging of high direct-current power in sputtering. In addition, because of no description, in particular, on adjustment of $Ga_2O_3$ powders to fine powders or the like, it is estimated that coarse powders with an average particle diameter of over 1 μm are used, and in this case, a constitution of the oxide sintered body as a raw material has crystal grains composed of the $GaInO_3$ phase, or the $GaInO_3$ phase and the $(Ga,In)_2O_3$ phase, having an average particle diameter of far over 5 μm, and a nodule generates by sputtering under enhanced film-formation rate.

3. A Target

The target of the present invention may be obtained by cutting the above oxide sintered body to predetermined dimension and by processing by surface grinding and then by adhering to a backing plate. The target in the present invention includes a target for sputtering and a target for ion plating.

In the case of the target for sputtering, density thereof is preferably equal to or higher than 6.3 g/cm$^3$. The density of below 6.3 g/cm$^3$ generates cracks or fractures, causing generation of nodules. In addition, in the case of use for a target for ion plating, it is preferable that density is controlled at 3.4 to 5.5 g/cm$^3$. The density below 3.4 g/cm$^3$ provides inferior strength of a sintered body itself, and thus cracks or fractures easily generate even for small and local thermal expansion. The density of over 5.5 g/cm$^3$ makes impossible to absorb stress or strain generated locally in charging of electron beams, and cracks generate easily.

It is due to this reason for difference of firing condition for between a target for sputtering and a target for ion plating, in a production method for the above oxide sintered body. For sputtering, it is preferable that by adoption of a normal pressure firing method, a compact is sintered at 1250 to 1450° C. for 10 to 30 hours, in atmosphere in the presence of oxygen; or by adoption of a hot press method, mixed powders are sintered at 700 to 950° C. for 1 to 10 hours under a pressure of 2.45 to 29.40 MPa, in inert gas atmosphere or in vacuum. In addition, for ion plating, it is preferable that by adoption of a normal pressure firing method, a compact is sintered at 1000 to 1200° C. for 10 to 30 hours, in atmosphere in the presence of oxygen, so that density range becomes lower than target for sputtering, as described above.

4. A Transparent Conductive Film Containing Indium and Gallium, and a Film-Formation Method Therefor The transparent conductive film of the present invention is an amorphous transparent conductive film obtained by forming on a substrate, by a sputtering method or an ion plating method, by using the above target.

In the transparent conductive film of the present invention, there are two kinds: one having a content of gallium is equal to or higher than 10% by atom and below 35% by atom as atom number ratio of Ga/(In+Ga) (hereafter, this is referred to as a first oxide sintered body); and one where, other than indium and gallium, further one or more kinds selected from tin or germanium are contained, and the content of gallium is from 2 to 30% by atom as atom number ratio of Ga/(In+Ga+Sn+Ge), and the content of one or more kinds selected from tin or germanium is from 1 to 11% by atom as atom number ratio of (Sn+Ge)/(In+Ga+Sn+Ge) (hereafter, this is referred to as a second oxide sintered body).

In a sputtering method or the like for film-formation of a transparent conductive film, increase in direct-current power is performed generally to enhance film-formation rate. In the present invention, the first oxide sintered body containing indium and gallium has, as described above, crystal grains of the In$_2$O$_3$ phase and the GaInO$_3$ phase, or the In$_2$O$_3$ phase and the GaInO$_3$ phase and the (Ga,In)$_2$O$_3$ phase in said oxide sintered body, are refined and content of gallium in the oxide sintered body is 10% by atom to 30% by atom as atom number ratio of Ga/(In+Ga); and in addition, the second oxide sintered body has content of gallium of from 2 to 30% by atom as atom number ratio of Ga/(In+Ga+Sn+Ge), and the content of one or more kinds selected from tin and germanium of from 1 to 11% by atom as atom number ratio of (Sn+Ge)/(In+Ga+Sn+Ge).

Because the GaInO$_3$ phase and the (Ga,In)$_2$O$_3$ phase are finely dispersed in the In$_2$O$_3$ phase, it makes difficult for them to become starting points of nodule growth, and thus nodule generation is suppressed even when direct-current power to be charged is increased, which, as a result, enables to suppress abnormal discharge such as arcing.

In the case where the transparent conductive film of the present invention is formed on a substrate by a sputtering method, in particular, in the case of a direct-current (DC) sputtering method, there is no thermal influence in film-formation, and high rate film-formation is possible, and thus it is industrially advantageous. In order to form the oxide sintered body of the present invention by a direct-current sputtering method, it is preferable to use mixed gas composed of inert gas and oxygen, in particular, argon and oxygen, as sputtering gas. In addition, it is preferable that sputtering is performed by setting of pressure inside a chamber of a sputtering apparatus at from 0.1 to 1 Pa, in particular, from 0.2 to 0.8 Pa.

In the present invention, for example, pre-sputtering may be performed, after vacuum exhaustion, for example, down to equal to or lower than $2\times10^{-4}$ Pa, by introduction of mixed gas composed of argon and oxygen to set the gas pressure at from 0.2 to 0.5 Pa, and by application of direct-current power so that direct-current power to the target area, that is, direct-current power density, is in a range of from about 1 to 3 W/cm$^2$, to generate direct-current plasma. After performing of this pre-sputtering for from 5 to 30 minutes, it is preferable to perform sputtering by correction of a substrate position, if necessary.

In the present invention, film-formation is possible at room temperature without heating the substrate, however, the substrate may be heated at from 50 to 300° C., in particular, from 80 to 200° C. In the case where the substrate is one with low melting point, such as a resin plate, a resin film, it is desirable to perform film-formation without heating. Use of a sputtering target prepared from the above oxide sintered body of the present invention enables to produce the oxide sintered body with excellent optical characteristics and conductivity on the substrate, by a direct-current sputtering method, in relatively high film-formation rate.

In addition, also in the case of using a target for ion plating (it may be called a tablet or a pellet) prepared from the above oxide sintered body, a transparent conductive film can be formed similarly. In an ion plating method, as described above, irradiation of electron beams or heat by arc discharge or the like onto a target to become an evaporation source, raises temperature locally at a part irradiated, by which particles are evaporated and deposited onto a substrate. In this case, evaporated particles are ionized by electron beams or arc discharge. There are various methods for ionization, however, a high density plasma assisted vapor deposition method (HDPE method) using a plasma generation apparatus (a plasma gun) is suitable for forming a transparent conductive film with good quality. In this method, arc discharge by using the plasma gun is utilized. Arc discharge is maintained between a built-in cathode in said plasma gun and an evaporation source crucible (anode). By introducing the electrons emitted from the cathode into the crucible by magnetic deflection, irradiation is concentrated locally onto the target incorporated in the crucible. By this electron beams, particles are evaporated from a locally high temperature part, and deposited onto the substrate. Because evaporated particles thus vaporized or O2 gas introduced as reaction gas is ionized and activated in this plasma, a transparent conductive film with good quality can be prepared.

The transparent conductive film of the present invention is prepared by using a target prepared by processing the oxide sintered body of the present invention, and by the above sputtering method or ion plating method, and is present in an amorphous state irrespective of substrate temperature.

In general, an ITO film becomes a crystalline state when the substrate temperature is increased to about 200° C., although it shows an amorphous state at room temperature. However, the transparent conductive film of the present invention keeps an amorphous state, even when the substrate temperature is increased to 300° C. As reason for keeping an amorphous state even at high temperature, it is considered that there is present, in the oxide sintered body as a raw material of the present invention, the finely dispersed $GaInO_3$ phase, or $GaInO_3$ phase and $(Ga,In)_2O_3$ phase, in an average particle diameter of equal to or smaller than 5 μm, preferably equal to or smaller than 3 μm. It is considered that, in the transparent conductive film of the present invention, an amorphous part derived from a composite oxide phase finely dispersed with these, and an amorphous part derived from the $In_2O_3$ phase are present together. It is estimated that because the former does not crystallize so easily, even at a high temperature of over 400° C., the latter, which originally tends to crystallize easily, can not crystallize.

Because the transparent conductive film of the present invention is an amorphous film, as described above, therefore arithmetic average height Ra, representing surface roughness, is equal to or lower than 1.0 nm, and is very flat. A film having such flat surface is suitable to applications such as organic EL, which dislikes leakage caused by film irregularity. In addition, an amorphous transparent conductive film has advantage of no generation of a residue in wet-etching. Therefore, it is particularly advantageous in applications of TFT of a liquid crystal device and the like, where thinning of wiring patterning of the transparent conductive film is progressing.

Thickness of the transparent conductive film of the present invention is not especially specified, because it differs depending on applications, however, it is from 10 to 500 nm, and preferably from 50 to 300 nm. The thickness below 10 nm may not ensure sufficient specific resistance, while the thickness over 500 nm results in raising a problem of coloring of the film, and thus not preferable.

In addition, average transmittance in a visible region (400 to 800 nm) of the transparent conductive film of the present invention is equal to or higher than 80%, preferably equal to or higher than 85% and still more preferably equal to or higher than 90%. The average transmittance of below 80% makes applications to an organic EL element and the like difficult.

The transparent conductive film of the present invention has low light absorption, in particular, at a short wavelength side of a visible region, and high transmittance. Usually, an ITO film formed at room temperature has high light absorption at a short wavelength side of a wavelength of around 400 nm, and extinction coefficient at a wavelength of 400 nm is over 0.04. On the contrary, the transparent conductive film of the present invention shows extinction coefficient at a wavelength of 400 nm of equal to or smaller than 0.04, and it becomes equal to or lower than 0.03, in the case where content of gallium is equal to or higher than 20% by atom and below 35% by atom as atom number ratio of Ga/(In+Ga), in the first transparent conductive film. Therefore, it is suitable as a transparent electrode of a blue LED, which emits light of a wavelength of about 400 nm.

In general, in order to use a transparent conductive film in wide application fields, it is preferable that specific resistance is equal to or lower than $2\times10^{-3}$ Ω·cm. In the applications of the above liquid crystal device or blue LED or the like, specific resistance is required to be below $1\times10^{-3}$ Ω·cm. Specific resistance of the transparent conductive film obtained by using the oxide sintered body containing indium and gallium of the present invention, decreases by increase in the In component. Because the transparent conductive film of the present invention shows a specific resistance of equal to or lower than $2\times10^{-3}$ Ω·cm, applications to various devices are possible. Further, in the first transparent conductive film having composition range where content of gallium is 10 to 25% by atom as atom number ratio of Ga/(In+Ga), specific resistance exhibits below $1\times10^{-3}$ Ω·cm, in addition, in the second transparent conductive film, in the case where the content of gallium is from 2 to 20% by atom as atom number ratio of Ga/(In+Ga+Sn+Ge), and the content of the additive components is from 2 to 10% by atom as atom number ratio of (Sn+Ge)/(In+Ga+Sn+Ge), specific resistance exhibits similarly below $1\times10^{-3}$ Ω·cm, and also superiority of optical characteristics at the above short wavelength side of a visible region is maintained, which therefore provides usefulness in applications, in particular, for a blue LED and the like.

5. A Transparent Conductive Substrate

In the transparent conductive substrate of the present invention, the above transparent conductive film is formed on one surface or both surfaces of the transparent substrate. The transparent substrate is usually selected from a glass plate, a quartz plate, a resin plate or a resin film.

This transparent conductive substrate is one to have the above transparent conductive film function as an anode and/or a cathode of a display panel such as LCD, PDP or an EL element. Because the substrate also functions as a light transmittable supporting body, it is required to have a certain strength and transparency.

As a material constituting the resin plate or the resin film, there may be included polyethyleneterephtharate (PET), polyethersulfone (PES), polyarylate (PAR), polycarbonate (PC) or the like, and it may be the resin plate or the resin film having a structure covered with an acrylic resin on the surface thereof.

Thickness of the substrate is not especially limited, however, it is set to be from 0.5 to 10 mm, preferably from 1 to 5 mm for the glass plate or the quartz plate, and for the resin plate or the resin film, from 0.1 to 5 mm, preferably from 1 to 3 mm. Thinner thickness than this range decreases strength and makes handling thereof difficult, while thicker thickness than this range not only deteriorates transparency but also makes heavy, and thus not preferable.

On the above substrate, there may be formed any of an insulation layer, a semiconductor layer, a gas barrier layer, or a protection layer made of a single layer or a multi-layer. As the insulation layer, a silicon oxide (Si—O) layer or a silicon oxynitride (Si—O—N) layer or the like is included; as the semiconductor layer, a thin film transistor (TFT) or the like is included, which is mainly formed on a glass substrate; as the gas barrier layer, there is formed a silicon oxide (Si—O) film, silicon oxynitride (Si—O—N) film, a magnesium aluminate (Al—Mg—O) film, or a tin oxide-type (for Example, Sn—Si—O) film or the like as a steam barrier film, on the resin plate or the resin film. The protection layer is one to protect the substrate surface from scratch or impact, and various coatings such as an Si-type, a Ti-type, an acrylic resin-type are used. It should be noted that a layer formable on the substrate is not limited thereto, and a thin metal film having conductivity may also be applied.

The transparent conductive substrate obtained by the present invention is extremely useful as constitution parts of various display panels, because a transparent conductive film having excellent characteristics in view of specific resistance, light transmittance, surface flatness or the like, is formed thereon. In addition, as surface mounted parts in an electronic circuit provided with the above transparent conductive substrate, laser parts and the like other than an organic EL element are included.

EXAMPLES

Explanation will be given below in more detail with reference to Example of the present invention, however, the present invention should not be limited to these Example.
<Evaluation of an Oxide Sintered Body>

By using the end material of the oxide sintered body obtained, density of the sintered body was determined by the Archimedes' method. Subsequently a part of the end material was crushed to perform identification of generated phases by a powder method, with an X-ray diffraction apparatus (manufactured by Philips Co., Ltd.). Then as for the oxide sintered body containing indium and gallium as oxides, intensity ratio of X-ray diffraction peaks defined by the following expression (1) was determined.

$$I[GaInO_3 \text{ phase}(111)]/\{I[In_2O_3 \text{ phase}(400)]+I[GaInO_3 \text{ phase }(111)]\} \times 100[\%] \quad (1)$$

It should be noted that, as for the oxide sintered bodies (Examples 8, 11 to 15), containing further one or more kinds of additive components selected from tin or germanium, other than indium and gallium, intensity ratio of X-ray diffraction peaks, defined by the following expression (3) was determined.

$$I[GaInO_3 \text{ phase}(-111)]/\{I[In_2O_3 \text{ phase}(400)]+I[GaInO_3 \text{ phase }(-111)]\} \times 100[\%] \quad (3)$$

(wherein $I[In_2O_3 \text{ phase }(400)]$ represents (400) peak intensity of the $In_2O_3$ phase with a bixbyite-type structure, and $I[GaInO_3 \text{ phase }(111)]$ or $I[GaInO_3 \text{ phase }(-111)]$ represents (111) or (-111) peak intensity of a composite oxide of $\beta$-$GaInO_3$ phase with a $\beta$-$Ga_2O_3$-type structure, respectively).

By using a part of the powders, composition analysis of the oxide sintered body was performed by an ICP emission spectroscopy. Further, using with SEM (manufactured by Carl Zeiss Japan Co., Ltd.), constitution observation of the oxide sintered body was performed. From the image analysis result of SEM image, average particle diameter of the crystal grains composed of the $GaInO_3$ phase was determined.
<Evaluation of Fundamental Characteristics of a Transparent Conductive Film>

Composition of the obtained transparent conductive film was studied by an ICP emission spectroscopy. Film thickness of the transparent conductive film was measured with a surface roughness tester (manufactured by Tencor Japan Corp.). Film-formation rate was calculated from film thickness and film-formation time. Specific resistance of the film was calculated from a product of surface resistance measured by a four-probe method and film thickness.

Generated phases of the film were identified by X-ray diffraction measurement, similarly for the oxide sintered body. In addition, extinction coefficient was measured by using the Spectro Elipsometer (manufactured by J. A. Woolam Co., Ltd.), and in order to evaluate absorption characteristics of, in particular, blue light, extinction coefficient of a wavelength of 400 nm was compared.

Example 1

Zinc oxide powders and gallium oxide powders were adjusted to have an average particle diameter of equal to or smaller than 1 μm to prepare raw material powders. These powders were formulated, so that content of gallium is 10% by atom as atom number ratio represented by Ga/(In+Ga), and charged in a pot made of a resin, together with water to mix in a wet-type ball mill. In this case, hard-type ZrO2 balls were used, and mixing time was set to 18 hours. After the mixing, slurry was taken out, filtered, dried and granulated. The granulated substances were converted to a compact under a pressure of 3 tons/cm², by using a cold isostatic press.

Then, the compact was sintered as follows. Sintering was performed under atmosphere by introduction of oxygen into a sintering furnace in a rate of 5 L/minute per 0.1 m³ of furnace volume, at a sintering temperature of 1400° C. for 20 hours. In this case, temperature increasing rate was 1° C./minute, and in cooling after sintering, oxygen introduction was stopped, and temperature was cooled to 1000° C., at a rate of 10° C./minute. The obtained oxide sintered body was processed to a size of 152 mm in diameter and 5 mm in thickness, and the sputtering surface thereof was polished by using a cup grinding stone so that Rz of maximal height becomes equal to or lower than 3.0 μm. The processed oxide sintered body was subjected to bonding to a backing plate made of oxygen-free copper using metal indium, to prepare a target for sputtering.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a $\beta$-$Ga_2O_3$-type structure constituted by indium and gallium, and the $(Ga,In)_2O_3$ phase. Intensity ratio of X-ray diffraction peak of the $GaInO_3$ phase (111) represented by the above expression (1) was 8%.

Density of the oxide sintered body was measured and found to be 6.97 g/cm³. Subsequently, constitution observation of the oxide sintered body was performed with SEM, and found that average particle diameter of the $GaInO_3$ phase was 2.9 μm.

Next, the above sputtering target was attached to a cathode for a non-magnetic body target of a direct-current magnetron sputtering apparatus (manufactured by ANELVA Corp.) provided with a direct-current power source not having arcing suppression function. A non-alkali glass substrate (Corning #7059) was used as a substrate, and distance between the target and the substrate was fixed to 60 mm. Mixed gas of argon and oxygen was introduced, so that ratio of oxygen was 1.5%, after vacuum exhausting to below $1 \times 10^{-4}$ Pa, to adjust gas pressure to 0.5 Pa. It should be noted that in the above ratio of oxygen of 1.5%, specific resistance exhibited the lowest value.

A direct-current power of 200 W (1.10 W/cm²) was applied to generate direct-current plasma to perform sputtering. The direct-current sputtering was performed continuously till attaining of an integrated charge power value of 12.8 KWh, which is calculated from a product of direct-current power charged and sputtering time. Arcing did not generate during this period, and discharge was stable. After completion of sputtering, the target surface was observed and found no particular nodule generation. Then by changing the direct-current power to 200, 400, 500, 600 W (1.10 to 3.29 W/cm²), sputtering was performed for 10 minutes under each power to measure arcing generation times. Under any power, arcing did not generate and average arcing generation times per 1 minute under each direct-current power were zero.

Subsequently, film-formation was performed by direct-current sputtering. After pre-sputtering for 10 minutes, the substrate was allocated just over the sputtering target, that is, at a stationary opposed position, and sputtering was performed at room temperature without heating to form a transparent conductive film with a film thickness of 200 nm. It was confirmed that the composition of the obtained transparent conductive film was nearly the same as that of the target. By measurement of film-formation rate, it was confirmed to be 93 nm/minute. Then, by measurement of specific resistance of the film, it was confirmed to be $4.9\times10^{-4}$ $\Omega\cdot$cm. Generated phases of the film were identified by X-ray diffraction measurement, and confirmed to be amorphous. In addition, extinction coefficient of a wavelength of 400 nm was measured and found to be 0.03198. The above evaluation results of a target and evaluation results of film-formation are shown in Table 1.

Example 2

An oxide sintered body was prepared by a similar method as in Example 1, without changing the condition except that the content of gallium, as atom number ratio represented by Ga/(In+Ga) was changed to 20% by atom.

Figure 2:
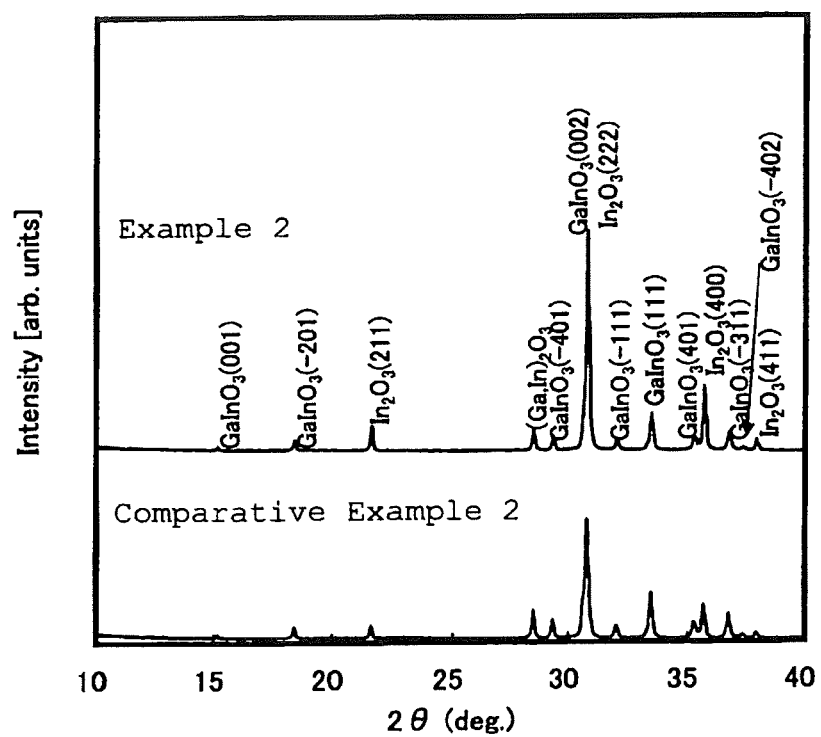
FIG. 2 is a chart showing X-ray diffraction results of the oxide sintered body of the present invention.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a $\beta$-$Ga_2O_3$-type structure constituted by indium and gallium, and the $(Ga,In)_2O_3$ phase. Then, an X-ray diffraction chart of the oxide sintered body is shown in FIG. 2. Intensity ratio of X-ray diffraction peak of the $GaInO_3$ phase (111) represented by the above expression (1) was 30%. Density of the oxide sintered body was measured and found to be 6.84 g/cm$^3$. Subsequently, constitution observation of the oxide sintered body was performed with SEM, and found that average particle diameter of the $GaInO_3$ phase was 2.6 μm.

Figure 3:
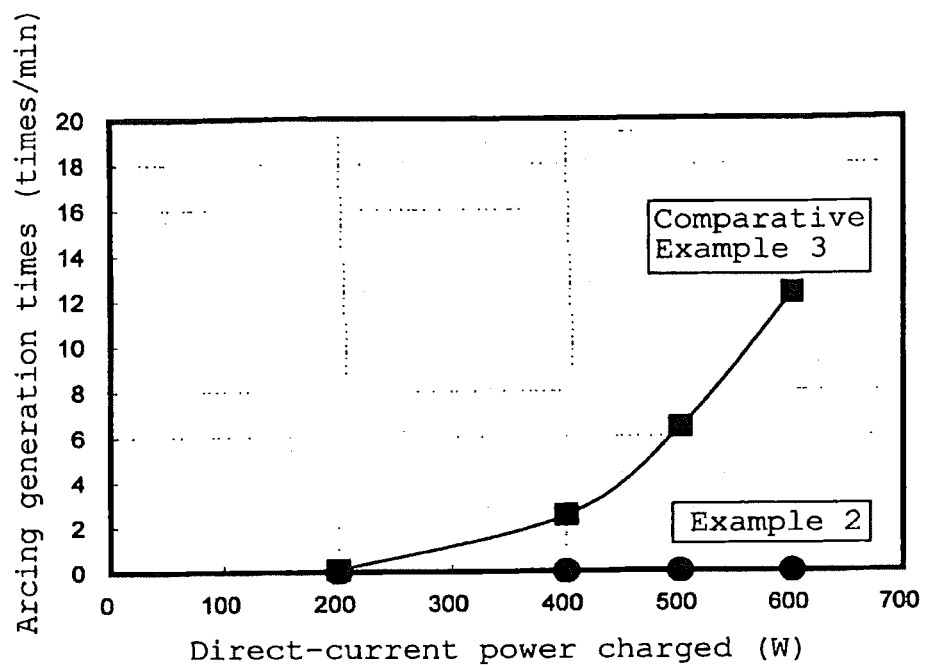
FIG. 3 is a graph showing relationship between charged direct-current power and arcing generation times, in sputtering with a target processed by an oxide sintered body.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by changing the direct-current power to 200, 400, 500, 600 W (1.10 to 3.29 W/cm$^2$), sputtering was performed for 10 minutes under each power to measure arcing generation times. FIG. 3 shows arcing generation times per 1 minute under each direct-current power. Under any power, arcing did not generate and average arcing generation times per 1 minute under each direct-current power were zero. Subsequently, film-formation was performed by direct-current sputtering. It was confirmed that the composition of the obtained transparent conductive film was nearly the same as that of the target. By measurement of film-formation rate, it was confirmed to be 86 nm/minute. Then, by measurement of specific resistance of the film, it was confirmed to be $7.8\times10^{-4}$ $\Omega\cdot$cm. Generated phases of the film were identified by X-ray diffraction measurement, and confirmed to be amorphous. In addition, extinction coefficient of a wavelength of 400 nm was measured and found to be 0.02769.

The above evaluation results of a target and evaluation results of film-formation are shown in Table 1.

Example 3

An oxide sintered body was prepared by a similar method as in Example 1, without changing the condition except that the content of gallium as atom number ratio represented by Ga/(In+Ga) was changed to 25% by atom.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a $\beta$-$Ga_2O_3$-type structure constituted by indium and gallium, and the $(Ga,In)_2O_3$ phase. Intensity ratio of X-ray diffraction peak of the $GaInO_3$ phase (111) represented by the above expression (1) was 39%. Density of the oxide sintered body was measured and found to be 6.77 g/cm$^3$. Subsequently, constitution observation of the oxide sintered body was performed with SEM, and found that average particle diameter of the $GaInO_3$ phase was 2.5 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by changing the direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 86 nm/minute. Then, by measurement of specific resistance of the film, it was confirmed to be $8.8\times10^{-4}$ $\Omega\cdot$cm. Generated phases of the film were identified by X-ray diffraction measurement, and confirmed to be amorphous. In addition, extinction coefficient of a wavelength of 400 nm was measured and found to be 0.02591.

The above evaluation results of a target and evaluation results of film-formation are shown in Table 1.

Example 4

An oxide sintered body was prepared by a similar method as in Example 1, without changing the condition except that the content of gallium as atom number ratio represented by Ga/(In+Ga) was changed to 30% by atom.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a $\beta$-$Ga_2O_3$-type structure constituted by indium and gallium, and the $(Ga,In)_2O_3$ phase. Intensity ratio of X-ray diffraction peak of the $GaInO_3$ phase (111) represented by the above expression (1) was 49%. Density of the oxide sintered body was measured and found to be 6.70 g/cm$^3$. Subsequently, constitution observation of the oxide sintered body was performed with SEM, and found that average particle diameter of the $GaInO_3$ phase was 2.8 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 84 nm/minute. Then, by measurement of specific resistance of the film, it was confirmed to be 1.4×10$^{-3}$ Ω·cm. Generated phases of the film were identified by X-ray diffraction measurement, and confirmed to be amorphous. In addition, extinction coefficient of a wavelength of 400 nm was measured and found to be 0.02361. The above evaluation results of a target and evaluation results of film-formation are shown in Table 1.

Example 5

An oxide sintered body was prepared by a similar method as in Example 1, without changing the condition except that the content of gallium as atom number ratio represented by Ga/(In+Ga) was changed to 34% by atom.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In$_2$O$_3$ phase with a bixbyite-type structure, the GaInO$_3$ phase with a β-Ga$_2$O$_3$-type structure, constituted by indium and gallium, and the (Ga,In)$_2$O$_3$ phase. Intensity ratio of X-ray diffraction peak of the GaInO$_3$ phase (111) represented by the above expression (1) was 58%. Density of the oxide sintered body was measured and found to be 6.63 g/cm$^3$. Subsequently, constitution observation of the oxide sintered body was performed with SEM, and found that average particle diameter of the GaInO$_3$ phase was 4.1 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 81 nm/minute. Then, by measurement of specific resistance of the film, it was confirmed to be 2.0×10$^{-3}$ Ω·cm. Generated phases of the film were identified by X-ray diffraction measurement, and confirmed to be amorphous. In addition, extinction coefficient of a wavelength of 400 nm was measured and found to be 0.02337.

The above evaluation results of a target and evaluation results of film-formation are shown in Table 1.

Example 6

An oxide sintered body was prepared by a similar method as in Example 2, without changing the condition except that sintering temperature was changed to 1250° C.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In$_2$O$_3$ phase with a bixbyite-type structure, the GaInO$_3$ phase with a β-Ga$_2$O$_3$-type structure, constituted by indium and gallium, and the (Ga,In)$_2$O$_3$ phase. Intensity ratio of X-ray diffraction peak of the GaInO$_3$ phase (111) represented by the above expression (1) was 28%. Density of the oxide sintered body was measured and found to be 6.33 g/cm$^3$. Subsequently, constitution observation of the oxide sintered body was performed with SEM, and found that average particle diameter of the GaInO$_3$ phase was 2.4 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 83 nm/minute. Then, by measurement of specific resistance of the film, it was confirmed to be 9.1×10$^{-4}$ Ω·cm. Generated phases of the film were identified by X-ray diffraction measurement, and confirmed to be amorphous. In addition, extinction coefficient of a wavelength of 400 nm was measured and found to be 0.02743.

The above evaluation results of a target and evaluation results of film-formation are shown in Table 1.

Example 7

An oxide sintered body was prepared by a similar method as in Example 2, without changing the condition except that sintering temperature was changed to 1450° C.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In$_2$O$_3$ phase with a bixbyite-type structure, the GaInO$_3$ phase with a β-Ga$_2$O$_3$-type structure, constituted by indium and gallium, and the (Ga,In)$_2$O$_3$ phase. Intensity ratio of X-ray diffraction peak of the GaInO$_3$ phase (111) represented by the above expression (1) was 31%. Density of the oxide sintered body was measured and found to be 6.88 g/cm$^3$. Subsequently, constitution observation of the oxide sintered body was performed with SEM, and found that average particle diameter of the GaInO$_3$ phase was 3.3 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 87 nm/minute. Then, by measurement of specific resistance of the film, it was confirmed to be $8.0 \times 10^{-4}$ Ω·cm. Generated phases of the film were identified by X-ray diffraction measurement, and confirmed to be amorphous. In addition, extinction coefficient of a wavelength of 400 nm was measured and found to be 0.02776.

The above evaluation results of a target and evaluation results of film-formation are shown in Table 1.

Example 8

An oxide sintered body was prepared by a similar method as in Example 2, without changing the condition except that similar gallium atom number ratio as in Example 2, that is, the content of gallium as atom number ratio represented by Ga/(In+Ga+Sn), was dispensed to 20% by atom, and still more, as the addition component, 6% by atom as atom number ratio represented by (Sn)/(In+Ga+Sn) of tin oxide powders with an average particle diameter of equal to or smaller than 1 μm was added.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be Constituted by the $In_2O_3$ phase with a bixbyite-type structure, the $GaInO_3$ phase with a β-$Ga_2O_3$-type structure constituted by indium and gallium, and the $(Ga,In)_2O_3$ phase. Intensity ratio of X-ray diffraction peak of the $GaInO_3$ phase (111) represented by the above expression (3) was 51%. Density of the oxide sintered body was measured and found to be 6.71 g/cm³. Subsequently, constitution observation of the oxide sintered body was performed with SEM, and found that average particle diameter of the $GaInO_3$ phase was 2.9 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm²) sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 89 nm/minute. Then, by measurement of specific resistance of the film, it was confirmed to be $9.1 \times 10^{-4}$ Ω·cm. Generated phases of the film were identified by X-ray diffraction measurement, and confirmed to be amorphous. In addition, extinction coefficient of a wavelength of 400 nm was measured and found to be 0.03482.

The above evaluation results of a target and evaluation results of film-formation are shown in Table 1. It should be noted that in the case where germanium oxide powders were used instead of tin oxide powders, or even in the case where tin oxide powders and germanium oxide powders were used at the same time, it was confirmed that nearly the same results are obtained.

Example 9

Film-formation was performed by changing the film-formation method to an ion plating method, and by using a tablet made of an oxide sintered body with similar composition as in Example 2.

A preparation method for the oxide sintered body was nearly similar preparation method as in the case of the sputtering target of Example 2, however, as described above, because density is required to be decreased in the case of use as a tablet for ion plating, sintering temperature was set at 1100° C. The tablet was compacted in advance so as to attain dimension after sintering of a diameter of 30 mm, and a height of 40 mm. Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a β-$Ga_2O_3$-type structure constituted by indium and gallium, and the $(Ga,In)_2O_3$ phase. Intensity ratio of X-ray diffraction peak of the $GaInO_3$ phase (111), represented by the above expression (1), was 27%. Density of the oxide sintered body was measured and found to be 4.79 g/cm³. Subsequently, constitution observation of the oxide sintered body was performed with SEM, and found that average particle diameter of the $GaInO_3$ phase was 2.1 μm.

By using such an oxide sintered body as a target, discharge by using a plasma gun by an ion plating method was performed till the tablet became unusable. As an ion plating apparatus, a reactive plasma vapor deposition apparatus, which is applicable to a high density plasma assisted vapor deposition method (HDPE method), was used. Film-formation conditions were set as follows: a distance between an evaporation source and a substrate of 0.6 m, a discharge current of the plasma gun of 100 A, an Ar flow rate of 30 sccm and an $O_2$ flow rate of 10 sccm. Problem such as splash was not raised, till the tablet became unusable.

Film-formation was performed after replacement of tablet. Composition of the obtained transparent conductive film was confirmed to be nearly the same as that of the tablet. A film-formation rate of 122 nm/min was obtained, and it was found that high rate film-formation equivalent to an ITO film was possible. Then, by measurement of specific resistance of the film, it was confirmed to be $6.5 \times 10^{-4}$ Ω·cm. Generated phases of the film were identified by X-ray diffraction measurement, and confirmed to be amorphous. In addition, extinction coefficient of a wavelength of 400 nm was measured and found to be 0.02722. The above evaluation results of a target and evaluation results of film-formation are shown in Table 1.

Example 10

On a PES (polyethersulfone) film substrate with a thickness of 100 μm, a silicon oxynitride film with a thickness of 100 nm was formed in advance, as a gas barrier film, and on said gas barrier film, a transparent conductive film composed of an oxide containing indium and gallium, with a thickness of 100 nm, was formed in the similar step as in Example 2, to prepare a transparent conductive substrate.

The obtained transparent conductive substrate was investigated, and confirmed that the transparent conductive film formed similarly as in Example 2 was amorphous, having a specific resistance of $7.5 \times 10^{-4}$ Ω·cm, and an average transmittance of a visible region of equal to or higher than 85%, therefore good characteristics was obtained.

Example 11

An oxide sintered body was prepared by a similar, method as in Example 8, without changing the condition except that the content of gallium of Example 8, that is, atom number ratio represented by Ga/(In+Ga+Sn), was changed to 2% by atom, along with tin was changed to 10% by atom as atom number ratio of represented by Sn/(In+Ga+Sn).

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a β-$Ga_2O_3$-type structure constituted by indium and gallium, and the $(Ga,In)_2O_3$ phase. Intensity ratio of X-ray diffraction peak of the $GaInO_3$ phase (111) represented by the above expression (3) was 4%. Density of the oxide sintered body was measured and found to be 6.87 g/cm$^3$. Subsequently, constitution observation of the oxide sintered body was performed with SEM, and found that average particle diameter of the $GaInO_3$ phase was 2.8 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 92 nm/minute. Then, by measurement of specific resistance of the film, it was confirmed to be $5.2 \times 10^{-4}$ Ω·cm. Generated phases of the film were identified by X-ray diffraction measurement, and confirmed to be amorphous. In addition, extinction coefficient of a wavelength of 400 nm was measured and found to be 0.03891.

The above evaluation results of a target and evaluation results of film-formation are shown in Table 1. It should be noted that in the case where germanium oxide powders were used instead of tin oxide powders, or even in the case where tin oxide powders and germanium oxide powders were used at the same time, it was confirmed that nearly the same results are obtained.

Example 12

An oxide sintered body was prepared by a similar method as in Example 8, without changing the condition except that the content of gallium of Example 8, that is, atom number ratio represented by Ga/(In+Ga+Sn), was changed to 5% by atom, along with tin was changed to 10% by atom as atom number ratio of represented by Sn/(In+Ga+Sn).

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a β-$Ga_2O_3$-type structure constituted by indium and gallium, and the $(Ga,In)_2O_3$ phase. Intensity ratio of X-ray diffraction peak of the $GaInO_3$ phase (111) represented by the above expression (3) was 7%. Density of the oxide sintered body was measured and found to be 6.90 g/cm$^{-1}$. Subsequently, constitution observation of the oxide sintered body was performed with SEM, and found that average particle diameter of the $GaInO_3$ phase was 2.7 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 92 nm/minute. Then, by measurement of specific resistance of the film, it was confirmed to be $5.0 \times 10^{-4}$ Ω·cm. Generated phases of the film were identified by X-ray diffraction measurement, and confirmed to be amorphous. In addition, extinction coefficient of a wavelength of 400 nm was measured and found to be 0.03711.

The above evaluation results of a target and evaluation results of film-formation are shown in Table 1.

Example 13

An oxide sintered body was prepared by a similar method as in Example 8, without changing the condition except that the content of gallium of Example 8, that is, atom number ratio represented by Ga/(In+Ga+Sn), was changed to 10% by atom, along with tin was changed to 10% by atom as atom number ratio of represented by Sn/(In+Ga+Sn).

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the $In_2O_3$ phase with a bixbyite-type structure, the $GaInO_3$ phase with a β-$Ga_2O_3$-type structure constituted by indium and gallium, and the $(Ga,In)_2O_3$ phase. Intensity ratio of X-ray diffraction peak of the $GaInO_3$ phase (111) represented by the above expression (3) was 48%. Density of the oxide sintered body was measured and found to be 6.99 g/cm$^3$. Subsequently, constitution observation of the oxide sintered body was performed with SEM, and found that average particle diameter of the $GaInO_3$ phase was 2.5 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 90 nm/minute. Then, by measurement of specific resistance of the film, it was confirmed to be 6.4×10$^{-4}$ Ω·cm. Generated phases of the film were identified by X-ray diffraction measurement, and confirmed to be amorphous. In addition, extinction coefficient of a wavelength of 400 nm was measured and found to be 0.03663.

The above evaluation results of a target and evaluation results of film-formation are shown in Table 1.

Example 14

An oxide sintered body was prepared by a similar method as in Example 8, without changing the condition except that the content of gallium of Example 8, that is, atom number ratio represented by Ga/(In+Ga+Sn), was changed to 15% by atom, along with tin was changed to 2% by atom as atom number ratio of represented by Sn/(In+Ga+Sn).

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In$_2$O$_3$ phase with a bixbyite-type structure, the GaInO$_3$ phase with a β-Ga$_2$O$_3$-type structure constituted by indium and gallium, and the (Ga,In)$_2$O$_3$ phase. In addition, presence of a Ga$_2$In$_6$Sn$_2$O$_{16}$ phase was also confirmed partially, although very weak. Intensity ratio of X-ray diffraction peak of the GaInO$_3$ phase (111) represented by the above expression (3) was 32%. Density of the oxide sintered body was measured and found to be 7.01 g/cm$^3$. Subsequently, constitution observation of the oxide sintered body was performed with SEM, and found that average particle diameter of the GaInO$_3$ phase was 2.6 μm. In addition, it was confirmed that particle diameter of the crystal of the Ga$_2$In$_6$Sn$_2$O$_{16}$ phase was equal to or smaller than 3 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 89 nm/minute. Then, by measurement of specific resistance of the film, it was confirmed to be 6.2×10$^{-4}$ Ω·cm. Generated phases of the film were identified by X-ray diffraction measurement, and confirmed to be amorphous. In addition, extinction coefficient of a wavelength of 400 nm was measured and found to be 0.03402.

The above evaluation results of a target and evaluation results of film-formation are shown in Table 1.

Example 15

An oxide sintered body was prepared by a similar method as in Example 8, without changing the condition except that the content of gallium of Example 8, that is, atom number ratio represented by Ga/(In+Ga+Sn), was changed to 30% by atom, along with tin was changed to 3% by atom as atom number ratio of represented by Sn/(In+Ga+Sn).

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In$_2$O$_3$ phase with a bixbyite-type structure, the GaInO$_3$ phase with a β-Ga$_2$O$_3$-type structure constituted by indium and gallium, and the (Ga,In)$_2$O$_3$ phase. Intensity ratio of X-ray diffraction peak of the GaInO$_3$ phase (111) represented by the above expression (3) was 84%. Density of the oxide sintered body was measured and found to be 6.71 g/cm$^3$. Subsequently, constitution observation of the oxide sintered body was performed with SEM, and found that average particle diameter of the GaInO$_3$ phase was 2.8 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm$^2$), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 85 nm/minute. Then, by measurement of specific resistance of the film, it was confirmed to be 1.8×10$^{-3}$ Ω·cm. Generated phases of the film were identified by X-ray diffraction measurement, and confirmed to be amorphous. In addition, extinction coefficient of a wavelength of 400 nm was measured and found to be 0.03213.

The above evaluation results of a target and evaluation results of film-formation are shown in Table 1.

Comparative Example 1

An oxide sintered body was prepared by a similar method as in Example 1, without changing the condition except that the content of gallium as atom number ratio represented by Ga/(In+Ga) was changed to 3% by atom.

Composition analysis of the obtained oxide sintered body was performed by an ICP emission spectrometry, and it was confirmed to be nearly the same as charging composition in formulation of raw material powders. Density of the oxide sintered body was measured and found to be 7.06 g/cm$^3$. Next, phase identification of the oxide sintered body was performed by X-ray diffraction measurement, and it was confirmed to be constituted only by the In$_2$O$_3$ phase with a bixbyite-type structure. That is, it was judged that the oxide sintered body, constituted by the In$_2$O$_3$ phase with a bixbyite-type structure having substantially a solid solution of gallium, the GaInO₃ phase of a β-Ga₂O₃-type structure constituted by indium and gallium, and/or the (Ga,In)₂O₃ phase, of the present invention, was not obtained in this composition. Therefore, further target evaluation was not performed, and only film-formation by direct-current sputtering was performed.

It was confirmed that the composition of the obtained transparent conductive film by direct-current sputtering was nearly the same as that of the target. By measurement of film-formation rate, it was confirmed to be 86 nm/minute. Then, by measurement of specific resistance of the film, it was confirmed to be $8.3 \times 10^{-4}$ Ω·cm. Generated phases of the film were identified by X-ray diffraction measurement, and confirmed to be amorphous. In addition, extinction coefficient of a wavelength of 400 nm was measured and found to be 0.04188. The above evaluation results of a target and evaluation results of film-formation are shown in Table 1.

Comparative Example 2

An oxide sintered body was prepared by a similar method as in Example 1, without changing the condition except that the content of gallium as atom number ratio represented by Ga/(In+Ga) was changed to 40% by atom.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In₂O₃ phase with a bixbyite-type structure, the GaInO₃ phase with a β-Ga₂O₃-type structure constituted by indium and gallium, and the (Ga,In)₂O₃ phase. Then as Example 2, an X-ray diffraction chart of the oxide sintered body is shown in FIG. 2. Intensity ratio of X-ray diffraction peak of the GaInO₃ phase (111) represented by the above expression (1) was 74%. Density of the oxide sintered body was measured and found to be 6.54 g/cm³. Subsequently, constitution observation of the oxide sintered body was performed with SEM, and found that average particle diameter of the GaInO₃ phase was 4.2 μm.

The direct-current sputtering was performed till attaining of an integrated charge power value of 12.8 KWh, by using this oxide sintered body as a sputtering target. Arcing did not generate during this period, and discharge was stable. After completion of sputtering, the target surface was observed and found no particular nodule generation. Then by change of direct-current power to 200, 400, 500, 600 W (1.10 to 3.29 W/cm²), sputtering was performed for 10 minutes under each power to measure arcing generation times. Under any power, arcing did not generate and average arcing generation times per 1 minute under each direct-current power were zero.

Subsequently, film-formation was performed by direct-current sputtering. It was confirmed that the composition of the obtained transparent conductive film was nearly the same as that of the target. By measurement of film-formation rate, it was confirmed to be 62 nm/minute. Then, by measurement of specific resistance of the film, it was confirmed to be $3.5 \times 10^{-3}$ Ω·cm. Generated phases of the film were identified by X-ray diffraction measurement, and confirmed to be amorphous. In addition, extinction coefficient of a wavelength of 400 nm was measured and found to be 0.01811.

The above evaluation results of a target and evaluation results of film-formation are shown in Table 1.

Comparative Example 3

An oxide sintered body was prepared by a similar method as in Example 2, without changing the condition except that indium oxide powders and gallium oxide powders with average particle diameter of about 3 μm were used.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In₂O₃ phase with a bixbyite-type structure, the GaInO₃ phase with a β-Ga₂O₃-type structure constituted by indium and gallium, and the (Ga,In)₂O₃ phase. Intensity ratio of X-ray diffraction peak of the GaInO₃ phase (111) represented by the above expression (1) was 42%. Density of the oxide sintered body was measured and found to be 6.23 g/cm³. Subsequently, constitution observation of the oxide sintered body was performed with SEM, and found that average particle diameter of the GaInO₃ phase was 5.8 μm.

The direct-current sputtering was performed till attaining of an integrated charge power value of 12.8 KWh, by using this oxide sintered body as a sputtering target. For certain period after starting the sputtering, arcing did not generate, however, at the time reaching near the above integration time, arcing gradually generated. Target surface was observed after reaching the above integration time, and generation of many nodules were confirmed. Then by change of direct-current power to 200, 400, 500, 600 W (1.10 to 3.29 W/cm²), sputtering was performed for 10 minutes under each power to measure arcing generation times. FIG. 3 shows arcing generation times per 1 minute under each direct-current power, along with Example 2. From FIG. 3, it is clear that generation of arcing becomes frequent with increase in direct-current power.

Film-formation was performed by direct-current sputtering by using this oxide sintered body as a sputtering target. Arcing generated frequently during film-formation. It was confirmed that the composition of the obtained transparent conductive film was nearly the same as that of the target. By measurement of film-formation rate, it was confirmed to be 71 nm/minute. Then, generated phases of the film were identified by X-ray diffraction measurement, and confirmed to be amorphous. By measurement of specific resistance of the film, it was confirmed to be $4.1 \times 10^{-3}$ Ω·cm. In addition, extinction coefficient of a wavelength of 400 nm was measured and found to be 0.03323. The above evaluation results of a target and evaluation results of film-formation are shown in Table 1.

Comparative Example 4

An oxide sintered body was prepared by a similar method as in Example 2, without changing the condition except that sintering temperature was changed to 1000° C.

Composition analysis of the obtained oxide sintered body was performed by an ICP emission spectrometry, and it was confirmed to be nearly the same as charging composition in formulation of raw material powders. Next, phase identification of the oxide sintered body was performed by X-ray diffraction measurement, and it was confirmed to be constituted by the In₂O₃ phase with a bixbyite-type structure, the GaInO₃ phase with a β-Ga₂O₃-type structure constituted by indium and gallium, and the (Ga,In)₂O₃ phase. Intensity ratio of X-ray diffraction peak of the GaInO₃ phase (111) represented by the above expression (1) was 26%. Density of the oxide sintered body was measured and found to be 5.73 g/cm³. Subsequently, constitution observation of the oxide sintered body was performed with SEM, and found that average particle diameter of the GaInO₃ phase was 2.1 μm.

Direct-current sputtering was performed by using this oxide sintered body as a sputtering target. After starting the sputtering, arcing generated at the early stage, and continuation of the sputtering became impossible for a long time when an integration charge power value reached 12.8 kWh. Target surface was observed and confirmed generation of cracks. Therefore, measurement of arcing generation times was abandoned, and direct-current sputtering under low power condition was tried. The sputtering was possible till a charge power of about 30 W, however, arcing became generating when the power was over 50 W. Therefore, it was judged that practical film-formation was impossible.

The above evaluation results of a target and evaluation results of film-formation are shown in Table 1.

Comparative Example 5

Film-formation was performed by direct-current sputtering by using a commercially available ITO target ($In_2O_3$-10% by weight $SnO_2$, manufactured by Sumitomo Metal Mining Co., Ltd.). Density of the ITO target was measured and found to be 7.11 g/cm³. Composition of the obtained transparent conductive film was confirmed to be nearly the same as the target. By measurement of film-formation rate, it was confirmed to be 92 nm/minute. Then, generated phases of the film were identified by X-ray diffraction measurement, and confirmed to be amorphous. By measurement of specific resistance of the film, it was confirmed to be $4.9 \times 10^{-4}$ Ω·cm. In addition, extinction coefficient of a wavelength of 400 nm was measured and found to be 0.04308. The above evaluation results of a target and evaluation results of film-formation are shown in Table 1.

[Evaluation]

From Examples 1 to 7, it was confirmed that the oxide sintered body sintered at a sintering temperature of from 1250 to 1400° C. by using the indium oxide powders and the gallium oxide powders with average particle diameter adjusted to equal to or smaller than 1 μm, and having content of gallium as atom number ratio of Ga/(In+Ga) in a range of equal to or higher than 10% by atom and below 35% by atom, was constituted by the $In_2O_3$ phase with a bixbyite-type structure having a solid solution of gallium, and the $GaInO_3$ phase of a β-$Ga_2O_3$-type structure constituted by indium and gallium, or the $In_2O_3$ phase with a bixbyite-type structure having a solid solution of gallium, and the $GaInO_3$ phase of a β-$Ga_2O_3$-type structure constituted by indium and gallium and the $(Ga,In)_2O_3$ phase). In addition, it was confirmed that intensity ratio of X-ray diffraction peaks of $In_2O_3$ phase (400) and $GaInO_3$ phase (111) is from 8% to 58%, and finely dispersed constitution, wherein the crystal grains composed of the $GaInO_3$ phase, or the $GaInO_3$ phase and the $(Ga,In)_2O_3$ phase have an average particle diameter of equal to or smaller than 5 μm, is obtained.

In particular, Examples 1 to 4 and 6 provided a constitution, wherein the crystal grains composed of the $GaInO_3$ phase, or the $GaInO_3$ phase and the $(Ga,In)_2O_3$ phase are finely dispersed in an average particle diameter of equal to or smaller than 3 μm. In addition, densities of the sintered bodies were equal to or higher than 6.3 g/cm³, all exhibited high densities. Direct-current sputtering was performed by using these oxide sintered bodies as sputtering targets, and it was clarified that there was no generation of nodules starting from the digging-residues of sputtering, even after continuous sputtering over a long time, and there was no arching generation even by changing the direct-current power in a range of from 200 to 600 W (1.10 to 3.29 W/cm²).

TABLE 1

| | Target evaluation | | | | | | | Film-formation evaluation | | | | |
|---|---|---|---|---|---|---|---|---|---|---|---|---|
| | Sintering temperature [° C.] | Ga atom ratio [% by atom] | Sn atom ratio [% by atom] | $GaInO_3$ phase crystal grain diameter [μm] | $GaInO_3$ (111) or (−111) peak intensity ratio | Nodule generation (○Yes, ✗No) | Arcing generation (○Yes, ✗No) | Density [g/cm3] | Film-formation method | Film-formation rate [nm/min] | Specific resistance [Ωcm] | Extinction coefficient | Crystallinity |
| Example 1 | 1400 | 10 | — | 2.9 | 8 | ○ | ○ | 6.97 | sputtering | 93 | $4.9 \times 10^{-4}$ | 0.03198 | amorphous |
| Example 2 | 1400 | 20 | — | 2.6 | 30 | ○ | ○ | 6.84 | sputtering | 86 | $7.8 \times 10^{-4}$ | 0.02769 | amorphous |
| Example 3 | 1400 | 25 | — | 2.5 | 39 | ○ | ○ | 6.77 | sputtering | 86 | $8.8 \times 10^{-4}$ | 0.02591 | amorphous |
| Example 4 | 1400 | 30 | — | 2.8 | 49 | ○ | ○ | 6.70 | sputtering | 84 | $1.4 \times 10^{-3}$ | 0.02361 | amorphous |
| Example 5 | 1400 | 34 | — | 4.1 | 58 | ○ | ○ | 6.63 | sputtering | 81 | $2.0 \times 10^{-3}$ | 0.02337 | amorphous |
| Example 6 | 1250 | 20 | — | 2.4 | 28 | ○ | ○ | 6.33 | sputtering | 83 | $9.1 \times 10^{-4}$ | 0.02743 | amorphous |
| Example 7 | 1450 | 20 | — | 3.3 | 31 | ○ | ○ | 6.88 | sputtering | 87 | $8.0 \times 10^{-4}$ | 0.02776 | amorphous |
| Example 8 | 1400 | 20 | 6 | 2.9 | 51 | ○ | ○ | 6.71 | sputtering | 89 | $9.1 \times 10^{-4}$ | 0.03482 | amorphous |
| Example 9 | 1100 | 20 | — | 2.1 | 27 | ○ | ○ | 4.79 | ion plating | 122 | $6.5 \times 10^{-4}$ | 0.02722 | amorphous |
| Example 11 | 1400 | 2 | 10 | 2.8 | 4 | ○ | ○ | 6.87 | sputtering | 92 | $5.2 \times 10^{-4}$ | 0.03891 | amorphous |
| Example 12 | 1400 | 5 | 10 | 2.7 | 7 | ○ | ○ | 6.90 | sputtering | 92 | $5.0 \times 10^{-4}$ | 0.03711 | amorphous |
| Example 13 | 1400 | 10 | 10 | 2.5 | 48 | ○ | ○ | 6.99 | sputtering | 90 | $6.4 \times 10^{-4}$ | 0.03663 | amorphous |
| Example 14 | 1400 | 15 | 2 | 2.6 | 32 | ○ | ○ | 7.01 | sputtering | 89 | $6.2 \times 10^{-4}$ | 0.03402 | amorphous |
| Example 15 | 1400 | 30 | 3 | 2.8 | 84 | ○ | ○ | 6.71 | sputtering | 85 | $1.8 \times 10^{-3}$ | 0.03213 | amorphous |
| Com. Ex. 1 | 1400 | 3 | — | no generation of $GaInO_3$ | — | — | — | 7.06 | sputtering | 86 | $8.3 \times 10^{-4}$ | 0.04188 | amorphous |
| Com. Ex. 2 | 1400 | 40 | — | 4.2 | 74 | ○ | ○ | 6.54 | sputtering | 62 | $3.5 \times 10^{-3}$ | 0.01811 | amorphous |
| Com. Ex. 3 | 1400 | 20 | — | 5.8 | 42 | ✗ | ✗ | 6.23 | sputtering | 71 | $4.1 \times 10^{-3}$ | 0.03323 | amorphous |
| Com. Ex. 4 | 1000 | 20 | — | 2.1 | 26 | ○ | ✗ | 5.73 | sputtering | — | — | — | — |
| Com. Ex. 5 | ITO ($In_2O_3$—10 wt % $SnO_2$) | | | — | — | — | — | 7.11 | sputtering | 92 | $4.9 \times 10^{-4}$ | 0.04308 | amorphous |

Film-formation rates in Examples 1 to 7 were from 81 to 93 nm/min, it was by no means inferior to a film-formation rate of ITO in Comparative Example 5 of 92 nm/min. Specific resistances of the obtained transparent conductive films are good, such as equal to or lower than $2\times10^{-3}$ Ω·cm, and in particular, in Examples 1 to 3, 6 and 7, in the case where a content of gallium is set to be from 10% to 25% by atom as atom number ratio of Ga/(In+Ga), still more lower specific resistances of $1\times10^{-4}$ Ω·cm level were obtained. In addition, extinction coefficient of the films at a wavelength of 400 nm showed from about 0.02 to 0.03, all showed equal to or lower than 0.04. Since the ITO film has extinction coefficient of over 0.04, it was confirmed that films of Examples 1 to 7 have low absorption of blue light.

Different point of Comparative Examples 1 and 2 compared with Examples 1 to 7 is that content of gallium as atom number ratio of Ga/(In+Ga) is not within a range of is equal to or higher than 10% by atom and below 35% by atom. In the case of low gallium content, crystal grains composed of the GaInO$_3$ phase, or the GaInO$_3$ phase and the (Ga,In)$_2$O$_3$ phase are not formed, and extinction coefficient at a wavelength of 400 nm becomes over 0.04. On the other hand, in the case of high gallium content, film-formation rate decreases significantly and also specific resistance of the film increases inevitably. Therefore it is clear that composition range providing good balance of the above characteristics is that content of gallium as atom number ratio of Ga/(In+Ga) is equal to or higher than 10% by atom and below 35% by atom.

Different point of Comparative Example 3 compared with Examples 1 to 7 is that relatively coarse indium oxide powders and gallium oxide powders with an average particle diameter of 3 μm were used, which brought about that the crystal grains composed of the GaInO$_3$ phase, or the GaInO$_3$ phase and the (Ga,In)$_2$O$_3$ phase dispersed in the oxide sintered body had an average particle diameter of over 5 μm. Direct-current sputtering was performed by using these oxide sintered bodies having such constitutions, as sputtering targets, and it was confirmed that nodules generated and arcing generated frequently after continuous sputtering for a long time. That is, it was clarified that, as in Examples 1 to 7, such constitutions of the oxide sintered body wherein the crystal grains composed of the GaInO$_3$ phase, or the GaInO$_3$ phase and the (Ga,In)$_2$O$_3$ phase are finely dispersed therein so as to have an average particle diameter of equal to or smaller than 5 μm, by using indium oxide powders and gallium oxide powders, with average particle diameter adjusted to equal to or smaller than 1 μm, are effective in suppression of nodule generation and arcing generation.

In addition, in Comparative Example 4, because sintering temperature was as low as 1000° C. compared with Examples 1 to 7, sintering did not progress and although the average particle diameter of the crystal grains composed of the GaInO$_3$ phase, or the GaInO$_3$ phase and the (Ga,In)$_2$O$_3$ phase was equal to or smaller than 5 μm, density of the sintered body did not reach 6.3 g/cm$^2$. In direct-current sputtering, a crack generated at the sputtering target and sputtering was limited only under a low power condition of about 30 W, and film-formation was substantially impossible. That is, it was clarified that for sufficient progress of sintering, a sintering temperature of 1000° C. is insufficient, and from 1250 to 1450° C. is suitable.

By Examples 8, 11 to 15, it was confirmed that the oxide sintered bodies added with tin, germanium, or both, or also the transparent conductive films exhibit good characteristics similarly as the oxide sintered bodies containing gallium and indium, or the transparent conductive films of Examples 1 to 7. In particular, by Examples 11 and 12, it was confirmed that in the case where tin or germanium, or both are added, even when gallium is in a composition range of lower addition quantity, an oxide sintered body composed of the In$_2$O$_3$ phase with a bixbyite-type structure having a solid solution of gallium and tin as a mother phase can be obtained, which is finely dispersed with the GaInO$_3$ phase of a β-Ga$_2$O$_3$-type structure constituted by indium, gallium and tin having an average particle diameter of equal to or smaller than 5 μm, or the GaInO$_3$ phase and the (Ga,In)$_2$O$_3$ phase of a β-Ga$_2$O$_3$-type structure, constituted by indium, gallium and tin, having an average particle diameter of equal to or smaller than 5 μm, similar to those in Examples 1 to 7, and still more those constitutions are effective in suppression of nodule generation and arcing generation.

In addition, by Example 9, it was clarified that, even in the case of an ion plating method, an oxide sintered body or a transparent conductive film exhibiting good characteristics can be obtained similarly as in Examples 1 to 8. Still more, by Example 10, it is found that by using the oxide sintered body of the present invention, a transparent conductive film exhibiting good characteristics, similarly as in Examples 1 to 9, can also be formed on a resin substrate with a moisture-proof film, if necessary, without limiting to a glass substrate.

What is claimed is:

1. An oxide sintered body comprising indium and gallium as an oxide, characterized in that an In$_2$O$_3$ phase with a bixbyite-type structure forms a major crystal phase, and a GaInO$_3$ phase of a β-Ga$_2$O$_3$-type structure, or GaInO$_3$ phase and a (Ga, In)$_2$O$_3$ phase is finely dispersed therein, as a crystal grain having an average particle diameter of equal to or smaller than 5 μm, and a content of gallium is from 10 to 25% by atom as atom number ratio of Ga/(In+Ga).

2. The oxide sintered body according to claim 1, characterized in that intensity ratio of X-ray diffraction peaks defined by the following expression, is from 8% to 58%:

I[GaInO$_3$ phase(111)]/{I[In$_2$O$_3$ phase(400)]+I[GaInO$_3$ phase(111)]}×100[%]

(wherein, I[In$_2$O$_3$ phase (400)] represents (400) peak intensity of the In$_2$O$_3$ phase with a bixbyite-type structure, and I[GaInO$_3$ phase (111)] represents (111) peak intensity of a composite oxide of β-GaInO$_3$ phase with a β-Ga$_2$O$_3$-type structure).

3. An oxide sintered body comprising indium and gallium as an oxide, characterized in that an In$_2$O$_3$ phase with a bixbyite-type structure forms a major crystal phase, and a GaInO$_3$ phase of a β-Ga2O3-type structure, or GaInO$_3$ phase and a (Ga, In)$_2$O$_3$ phase is finely dispersed therein, as a crystal grain having an average particle diameter of equal to or smaller than 5 μm, and other than indium and gallium, further one or more kinds of additive components selected from tin or germanium are contained, and the content of gallium is from 2 to 30% by atom as atom number ratio of Ga/(In+Ga+Sn+Ge), and the content of the additive components is from 1 to 11% by atom as atom number ratio of (Sn+Ge)/(In+Ga+Sn+Ge).

4. The oxide sintered body according to claim 3, characterized in that the content of gallium is from 2 to 20% by atom as atom number ratio of Ga/(In+Ga+Sn+Ge), and the content of one or more kinds selected from tin or germanium is from 2 to 10% by atom as atom number ratio of (Sn+Ge)/(In+Ga+Sn+Ge).

5. The oxide sintered body according to claim 3, characterized in that intensity ratio of X-ray diffraction peaks defined by the following expression, is from 4% to 84%:

$$I[GaInO_3\ phase(-111)]/\{I[In_2O_3\ phase(400)]+I[GaInO_3\ phase(-111)]\}\times 100[\%]$$

(wherein, I[In$_2$O$_3$ phase (400)] represents (400) peak intensity of the In$_2$O$_3$ phase with a bixbyite-type structure, and I[GaInO$_3$ phase (−111)] represents (−111) peak intensity of a composite oxide of β-GaInO$_3$ phase with a β-Ga$_2$O$_3$-type structure).

6. A production method for the oxide sintered body according to claim 1, by mixing the raw material powders comprising indium oxide powders and gallium oxide powders, or by adding the tin oxide powders and/or germanium oxide powders into this raw material powders, and mixing the mixture, and then by compacting the mixed powders and sintering the compact by a normal pressure firing method, or by compacting and sintering the mixed powders by a hot press method, characterized by obtaining of the oxide sintered body, where an In$_2$O$_3$ phase with a bixbyite-type structure forms a major crystal phase, and a GaInO3 phase, or GaInO3 phase and a (Ga, In)$_2$O$_3$ phase is finely dispersed therein, as a crystal grain having an average particle diameter of equal to or smaller than 5 μm, by adjustment of average particle diameter of the raw material powders to equal to or smaller than 1 μm.

7. The production method for the oxide sintered body according to claim 6, characterized in that the compact is sintered at 1250 to 1450° C. for 10 to 30 hours in atmosphere of oxygen presence, by adoption of the normal pressure firing method.

8. The production method for the oxide sintered body according to claim 6, characterized in that the compact is sintered at 1000 to 1200° C. for 10 to 30 hours in atmosphere of oxygen presence, by adoption of the normal pressure firing method.

9. The production method for the oxide sintered body according to claim 6, characterized in that the mixed powders are compacted and sintered at 700 to 950° C. for 1 to 10 hours under a pressure of 2.45 to 29.40 MPa in inert gas atmosphere or in vacuum, by adoption of a hot press method.

10. A target obtained by processing the oxide sintered body according to claim 1.

11. A target, characterized by obtaining by processing the oxide sintered body produced by the method according to claim 7, wherein density of the oxide sintered body is equal to or higher than 6.3 g/cm$^3$, and being used in formation of a transparent conductive film by a sputtering method.

12. A target, characterized by obtaining by processing the oxide sintered body produced by the method according to claim 8, wherein density of the oxide sintered body is from 3.4 to 5.5 g/cm$^3$, and being used in formation of a transparent conductive film by an ion plating method.

13. An amorphous transparent conductive film obtained by using the target according to claim 10, and by forming on a substrate, by a sputtering method or an ion plating method.

14. The transparent conductive film according to claim 13, characterized in that the content of gallium in the film is equal to or higher than 10% by atom and below 35% by atom as atom number ratio of Ga/(In+Ga).

15. The transparent conductive film according to claim 13, characterized in that the content of gallium in the film is from 2 to 30% by atom as atom number ratio of Ga/(In+Ga+Sn+Ge), and the content of one or more kinds selected from tin or germanium is from 1 to 11% by atom as atom number ratio of (Sn+Ge)/(In+Ga+Sn+Ge).

16. The transparent conductive film according to claim 13, characterized in that the sputtering is performed under condition that arcing does not generate, even by charging a direct-current power density of 1.10 to 3.29 W/cm$^2$.

17. The transparent conductive film according to any claim 13, characterized in that arithmetic average height Ra is equal to or lower than 1.0 nm.

18. The transparent conductive film according to claim 13, characterized in that extinction coefficient at a wavelength of 400 nm is equal to or smaller than 0.04.

19. The transparent conductive film according to claim 13, characterized in that specific resistance is equal to or lower than 2×10$^{-3}$ Ω·cm.

20. A transparent conductive substrate comprising by forming the transparent conductive film according to claim 13, onto one surface or both surfaces of the transparent conductive substrate.

21. The transparent conductive substrate according to claim 20, characterized in that a transparent substrate is any of a glass plate, a quartz plate, a resin plate or a resin film.

22. The transparent conductive substrate according to claim 21, characterized in that the resin plate or the resin film is a single body made of polyethylene terephthalate, polyethersulfone, polyarylate or polycarbonate as a material, or a laminated structure body where surface thereof is covered with an acryl-based organic substance.

23. The transparent conductive substrate according to claim 21, characterized in that the resin plate or the resin film is covered with a gas barrier film at one surface or both surfaces thereof, or is a laminated body inserted with a gas barrier film at the intermediate part thereof.

24. The transparent conductive substrate according to claim 23, characterized in that the above gas barrier film is one or more kinds selected from a silicon oxide film, a silicon oxynitride film, a magnesium aluminate film, a tin oxide-based film, or a diamond-like carbon film.

* * * * *